(12) United States Patent
Varma

(10) Patent No.: US 11,452,249 B2
(45) Date of Patent: Sep. 20, 2022

(54) CARRIER FOR REVERSIBLY IMMOBILIZING ONE OR MORE OBJECTS

(71) Applicant: DELPHON INDUSTRIES, LLC, Hayward, CA (US)

(72) Inventor: Rajesh Kumar Varma, Hayward, CA (US)

(73) Assignee: DELPHON INDUSTRIES, LLC, Hayward, CA (US)

( * ) Notice: Subject to any disclaimer, the term of this patent is extended or adjusted under 35 U.S.C. 154(b) by 62 days.

(21) Appl. No.: 16/771,345

(22) PCT Filed: Dec. 5, 2018

(86) PCT No.: PCT/US2018/064026
§ 371 (c)(1),
(2) Date: Jun. 10, 2020

(87) PCT Pub. No.: WO2019/118244
PCT Pub. Date: Jun. 20, 2019

(65) Prior Publication Data
US 2020/0352067 A1 Nov. 5, 2020

Related U.S. Application Data

(60) Provisional application No. 62/597,350, filed on Dec. 11, 2017.

(51) Int. Cl.
*H05K 13/04* (2006.01)
*B29C 48/08* (2019.01)
(Continued)

(52) U.S. Cl.
CPC ..... *H05K 13/0419* (2018.08); *B29C 48/0021* (2019.02); *B29C 48/08* (2019.02);
(Continued)

(58) Field of Classification Search
CPC .......... H03K 13/0419; H03K 13/0417; H03K 2201/10681; B65D 73/02; B65D 75/30;
(Continued)

(56) References Cited

U.S. PATENT DOCUMENTS 3,876,454 A 4/1975 Snell et al.
3,919,974 A 11/1975 Herzog
(Continued)

FOREIGN PATENT DOCUMENTS

JP 11438/1981 1/1981
KR 20150050551 A 5/2015

OTHER PUBLICATIONS

American Plastics Council, Inc., "Understanding Plastic Film: Its Uses, Benefits and Waste Management Options," pp. 1-30, Dec. 1996, available at https://plastics.americanchemistry.com/Understanding-Plastic-Film/; last accessed Oct. 1, 2019.
(Continued)

*Primary Examiner* — Chun Hoi Cheung
(74) *Attorney, Agent, or Firm* — Pearne & Gordon LLP

(57) ABSTRACT

A carrier for reversibly immobilizing one or more objects is disclosed. The carrier comprises a frame having a major axis, a top surface, a bottom surface, and one or more openings through the frame along the major axis. The carrier also comprises a film comprising a thermoplastic elastomer material and having a top surface and a bottom surface. The film is attached to the frame based on thermal bonding of the top surface of the film to the bottom surface of the frame, is under tension along the major axis, and is free to flex at the openings. The top surface of the film comprises one or more exposed top surface portions that are accessible through the openings. The exposed top surface portions exhibit a holding force on stainless steel as per ASTM D1000 that is greater than that of the bottom surface of the film.

20 Claims, 6 Drawing Sheets

(51) Int. Cl.
    *B29C 48/00*         (2019.01)
    *B65B 15/04*         (2006.01)
    *B65D 73/02*         (2006.01)
    *B65D 75/30*         (2006.01)
    *B65H 18/28*         (2006.01)
    *B29L 7/00*          (2006.01)

(52) U.S. Cl.
    CPC .............. *B65B 15/04* (2013.01); *B65D 73/02* (2013.01); *B65D 75/30* (2013.01); *B65H 18/28* (2013.01); *B29L 2007/007* (2013.01); *B65H 2701/1942* (2013.01)

(58) Field of Classification Search
    CPC ........... H05K 13/0419; H05K 13/0417; H05K 2201/10681; H05K 13/0084
    USPC ................................................ 206/713–717
    See application file for complete search history.

(56) References Cited

U.S. PATENT DOCUMENTS

| | | | | |
|---|---|---|---|---|
| 4,298,120 | A | * | 11/1981 | Kaneko ................ H05K 13/003 |
| | | | | 206/460 |
| 4,657,137 | A | | 4/1987 | Johnson |
| 4,966,281 | A | | 10/1990 | Kawanishi et al. |
| 5,089,314 | A | | 2/1992 | Masujima et al. |
| 5,203,143 | A | | 4/1993 | Gutentag |
| 5,351,821 | A | | 10/1994 | Skrtic |
| 5,524,765 | A | * | 6/1996 | Gutentag ........... H05K 13/0084 |
| | | | | 206/813 |
| 5,648,136 | A | * | 7/1997 | Bird .......................... B65B 9/04 |
| | | | | 428/34.3 |
| 5,682,731 | A | | 11/1997 | Althouse |
| 5,765,692 | A | * | 6/1998 | Schenz ................ H01L 21/6835 |
| | | | | 206/460 |
| 5,769,237 | A | * | 6/1998 | Althouse ............ H05K 13/0417 |
| | | | | 206/460 |
| 5,857,572 | A | * | 1/1999 | Bird ..................... H05K 13/003 |
| | | | | 206/716 |
| 6,370,750 | B1 | * | 4/2002 | Matsumura ....... H01L 21/67132 |
| | | | | 156/286 |
| 6,938,783 | B2 | | 9/2005 | Chung |
| 8,132,673 | B1 | * | 3/2012 | Gutentag ................ B65D 73/02 |
| | | | | 206/460 |
| 2004/0035747 | A1 | * | 2/2004 | Butler ................ H05K 13/0084 |
| | | | | 206/714 |
| 2006/0157381 | A1 | * | 7/2006 | Adams ............... H05K 13/0084 |
| | | | | 206/713 |
| 2006/0204749 | A1 | | 9/2006 | Kita |
| 2012/0037538 | A1 | | 2/2012 | Tokoi |
| 2015/0289427 | A1 | | 10/2015 | Ng |
| 2018/0166313 | A1 | | 6/2018 | Dai |
| 2019/0067072 | A1 | | 2/2019 | Chang et al. |
| 2020/0352067 | A1 | * | 11/2020 | Varma ................ H05K 13/0084 |

OTHER PUBLICATIONS

Monmouth Rubber & Plastics Corp., "Eva explained, what is it?" pp. 1-4, available at https://monmouthrubber.com/eva-explained-what-is-it/; last accessed Oct. 1, 2019.
Search Report and Written Opinion for International Application No. PCT/US2018/064026 dated Feb. 19, 2019.

\* cited by examiner

CARRIER FOR REVERSIBLY IMMOBILIZING ONE OR MORE OBJECTS

FIELD OF THE INVENTION

The present invention relates generally to carriers for reversibly immobilizing one or more objects, and more particularly to carriers for reversibly immobilizing one or more objects comprising a frame and a film attached to the frame.

BACKGROUND OF THE INVENTION

A carrier tape is a tape used in tape and reel applications for carrying objects, particularly electronic components, such as integrated circuit dies, for purposes of manufacturing and transportation. Various approaches have been developed for providing carrier tapes.

In a first approach, carrier tapes are produced including embossed pockets distributed along the carrier tapes. Typically, a carrier tape is custom-designed for the object that will be carried by the tape. For a given carrier tape, each pocket is embossed precisely to fit the object to be carried by the tape, which will be distributed as one object per pocket. This is in order to restrict movement of the objects within the pockets, during use of the carrier tape for carrying the objects, until release of the objects from the pockets. Typically, the carrier tapes are formed from a sheet of rigid plastic. The pockets are embossed in the rigid plastic by a process termed "thermoforming," resulting in embossed cavities in the rigid plastic into which the objects can be placed, secured, and carried.

The use of such carrier tapes for transporting objects presents problems. One problem is that, since the embossed cavities are formed in a rigid plastic, if an embossed cavity is larger than the object to be transported, then the object may be free to move and/or tilt within the embossed cavity, potentially resulting in "rattling," including lateral movement and/or a change in orientation of the object. Preferably, an embossed cavity should be designed to fit its corresponding object closely, so that the object cannot move more than 0.5 mm to 1.0 mm laterally within the cavity, and cannot tilt more than 10 degrees in any direction. Considering integrated circuit dies in particular, achieving such a fit can be practical for dies having relatively large sizes, e.g. 4 mm×4 mm or greater. For smaller dies, though, it is difficult to emboss cavities that fit their corresponding object sufficiently closely to ensure prevention of rattling. This creates challenges with respect to later handling of the objects, for example with respect to picking and placing integrated circuit dies where intended.

Another problem is that small objects can be ejected inadvertently from embossed cavities, in a process termed "trampolining," when a cover tape is removed to allow release of objects from cavities. Generally, a cover tape must be applied to a carrier tape that includes embossed cavities in order to secure objects within the cavities. The cover tape protects the objects by keeping out foreign contamination, and by keeping the objects inside the embossed cavities. Unfortunately, for small objects in particular, such as small integrated circuit dies, when a cover tape is peeled from a carrier tape, for example during a die pick process, the small objects can be ejected inadvertently from the embossed cavities, due to their small size and weight.

One approach for addressing the problems associated with carrier tapes that include precisely embossed pockets has been to apply a layer of adhesive onto cavities of a carrier tape so that objects placed in the cavities can be held in place without rattling or trampolining. This approach is taught in TDK Corporation's Japanese Utility Model Publication No. 11438/1981, which discloses applying a thermosetting adhesive to a surface of a tape. In accordance with this approach, an electronic circuit element series comprises a flat tape extending in a longitudinal direction and having a thermosetting adhesive applied onto a surface of the tape, and a plurality of electronic circuit elements held on the surface by the adhesive. Unfortunately, while the adhesive can be effective for holding the electronic circuit elements to the surface of the tape, TDK Corporation discloses problems with this approach in subsequent U.S. Pat. No. 5,089,314, stating that it is hard to release or extract the electronic circuit elements from the tape by the mounting head because the adhesive adheres to the entire bottom surfaces of the electronic circuit elements. The resulting adhesion is so strong as to prevent smooth picking, e.g. peeling, of the electronic circuit elements from the tape, and thus to prevent release of the electronic circuit elements.

Other approaches involving use of adhesives in carrier tapes also have been disclosed. One approach has been to pattern adhesives on the carrier tapes so that the adhesives contact only partial portions of the surfaces of objects, such as dies, to be carried. This provides for easier peeling, and thus release, of dies from tapes. This approach is intended to account for fundamentally high holding forces of adhesives. Examples of this approach have been disclosed by Kawanishi et al., U.S. Pat. No. 4,966,281, Gutentag-, U.S. Pat. No. 5,524,765, and Bird, U.S. Pat. No. 5,648,136. Another approach has been to lower tack force by using a UV cure adhesive that exhibits decreased tack after UV exposure, and conducting UV cure just before peeling dies from tapes. Examples of this approach have been disclosed by Chung, U.S. Pat. No. 6,938,783, and KR20150050551A.

Another approach, which is currently being used in the electronic, medical, and photonics industries, involves use of silicone elastomers in place of adhesives to hold objects to a carrier tape. For example, Althouse, U.S. Pat. No. 5,682,731, discloses a carrier tape involving use of a silicone elastomer in place of an adhesive to hold objects corresponding to electronic or electrical devices. Silicone elastomer has a lower tack than an adhesive, and thus does not result in excessive adhesion. Silicone elastomer is undesirable for device contact, though. This is because silicone is a lubricant, and thus transfer of silicone to the corresponding devices can occur, which can lead to problems with downstream processing of objects. Also, these carrier tapes involve use of a support plastic film, also termed "sub-film," on top of the carrier tape. Unfortunately, this results in the carrier tape having two rigid support films. This makes it difficult to peel dies from the carrier tape, because of full contact, as discussed above regarding the Japanese Utility Model Publication No. 11438/1981 and U.S. Pat. No. 5,089,314. This also prevents use of an ejector pin to push objects, such as dies, from the carrier tape, which is required in most die pick processes.

Another approach involves use of pressure-sensitive adhesives. For example, Gutentag, U.S. Pat. No. 5,203,143, discloses use of a pressure sensitive adhesive tape in conjunction with an apertured carrier tape to receive, retain, and release small components in automated assembly processing. The pressure sensitive adhesive tape holds the small components and bonds to the apertured tape. Like previous approaches, the adhesive has a film support. Since the apertured tape has to withstand transportation and other handling, the adhesive strength must be substantial. No specifics are provided, though, leaving open the question of whether the adhesion may be excessive. Also, because of the high adhesive strength, the tape is mounted as two parallel rails along the apertured carrier tape. The opening between the rails provides a means to reduce die holding force, which is conceptually like the previous approaches of patterning an adhesive for partial contact. Similarly, Gutentag, U.S. Pat. No. 5,524,765, discloses use of a combination of adhesive tape and a flexible gel material to address the problem of excessive bonding to adhesive. The pressure sensitive adhesive used is the same as for prior U.S. Pat. No. 5,203,143, but the only composition provided for the gel is "curable liquid polymer." Also, no description is given for how the gel would be bonded to the pressure sensitive adhesive. Accordingly, it is not clear how well this approach may work in practice.

A need exists for an improved carrier for reversibly immobilizing one or more objects, such as an electronic component, a wafer, a semiconductor material wafer, a silicon wafer, an integrated circuit wafer, a die, a semiconductor material die, a silicon die, an integrated circuit die, a photonic component, a photodiode component, a light emitting diode component, a pharmaceutical product, a pharmaceutical pill, a pharmaceutical capsule, a crystalline material object, or a jewel.

BRIEF SUMMARY OF THE INVENTION

A carrier for reversibly immobilizing one or more objects is provided. The carrier comprises (a) a frame having a major axis, a top surface, a bottom surface, and one or more openings through the frame along the major axis. The carrier also comprises (b) a film comprising a thermoplastic elastomer material and having a top surface and a bottom surface. The film is attached to the frame based on thermal bonding of the top surface of the film to the bottom surface of the frame, is under tension along the major axis of the frame, and is free to flex at the one or more openings through the frame. The top surface of the film comprises one or more exposed top surface portions that are accessible through the one or more openings through the frame. The one or more exposed top surface portions exhibit a holding force on stainless steel as per ASTM D1000 that is greater than that of the bottom surface of the film.

In some examples, the frame has a width of 6.0 to 60 mm. In some examples, the frame has a thickness of 0.10 to 5.0 mm. In some examples, the one or more openings each have an opening area of 2.0 to 1,100 mm². In some examples, the one or more openings, as seen from a top view, have a square shape, a rectangular shape, a circular shape, or an oval shape. Thus, in some examples, the frame has a width of 6.0 to 60 mm, the frame has a thickness of 0.10 to 5.0 mm, the one or more openings each have an opening area of 2.0 to 1,100 mm², and/or the one or more openings, as seen from a top view, have a square shape, a rectangular shape, a circular shape, or an oval shape.

In some examples, the frame comprises a plastic material. In some of these examples, the plastic material comprises one or more of polystyrene (PS), polycarbonate (PC), low density polyethylene (LDPE), high density polyethylene (HDPE), ethylene vinyl acetate (EVA), polypropylene, or an engineering plastic. Also in some of these examples, the frame further comprises an additive that provides electrostatic discharge properties. The additive that provides electrostatic discharge properties can comprise, for example, one or more of a carbon nanotube, carbon black, a carbon fiber, a conductive polymer, a conductive powder, a conductive fiber, a metal salt, a lithium salt, an antistatic additive, or a modified urethane.

In some examples, the frame further has sprocket holes along the major axis of the frame.

In some examples, the film has a thickness of 0.00050 to 0.010 inches (0.013 to 0.25 mm). In some examples, the thermal bonding comprises melting the top surface of the film to the bottom surface of the frame. In some examples, the film is attached to the frame without use of adhesive or bonding agent. In some examples, the one or more exposed top surface portions are unsupported. Thus, in some examples, the film has a thickness of 0.00050 to 0.010 inches (0.013 to 0.25 mm), the thermal bonding comprises melting the top surface of the film to the bottom surface of the frame, the film is attached to the frame without use of adhesive or bonding agent, and/or the one or more exposed top surface portions are unsupported.

In some examples, the thermoplastic elastomeric material of the film comprises one or more of thermoplastic urethane (TPU), thermoplastic co-polyesters (COPE), thermoplastic co-polyamides (COPA), thermoplastic olefin elastomer (e.g. copolymer of ethylene with one or more of propylene, butene, or octene), styrene-ethylene-butylene-styrene (SEBS), styrene-ethylene-propylene-styrene (SEPS), styrene-ethylene-ethylene-butylene-styrene (SEEBS), styrene-butadiene-styrene (SBS), styrene-isoprene-styrene (SIS), styrene-isobutylene-styrene (SIBS), poly(methyl methacrylate)-b-poly(n-butyl acrylate)-b-poly(methyl methacrylate) (PMMA-b-PnBA-b-PMMA), or ethylene vinyl acetate (EVA).

In some examples, the film further comprises one or more of a plasticizer, a reinforcing plastic, or an antioxidant. In some examples, the film further comprises an additive that provides electrostatic discharge properties. The additive that provides electrostatic discharge properties can comprise, for example, one or more of a carbon nanotube, carbon black, a carbon fiber, a conductive polymer, a conductive powder, a conductive fiber, a metal salt, a lithium salt, an antistatic additive, or a modified urethane.

In some examples, the film is substantially free of silicone. In some examples, the film is substantially free of adhesive. Thus, in some examples, the film is substantially free of silicone, and the film is substantially free of adhesive.

In some examples, the film exhibits one or more of the following properties: hysteresis of less than 9% when stretched up to 100%; elongation of greater than 400% at break; a tan $\Delta$ of less than 0.2 at room temperature (20° C.) when measured at 1 hertz; a primary $T_g$ lower than −20° C. when measured at 1 hertz; a Shore A durometer of less than 75 A; or a number average molecular weight ($M_n$) of a primary elastomer molecule of the thermoplastic elastomer material in final form being greater than 50,000 daltons.

In some examples, the film has a one-layer structure having a uniform composition. In some examples, the film has a two-layer structure comprising a first layer and an opposite second layer attached to the first layer, the first layer and the second layer both having a uniform composition, the uniform composition of the first layer being different than the uniform composition of the second layer. In some examples, the film has a three-layer structure comprising a first layer, an opposite second layer, and a third layer between the first layer and the second layer, the third layer bonding the first layer and the second layer, the first layer and the second layer both having a uniform composition, the uniform composition of the first layer being different than the uniform composition of the second layer.

In some examples, the one or more exposed top surface portions exhibit a holding force on stainless steel as per ASTM D1000 that is greater than that of the bottom surface of the film based on one or more of: the bottom surface of the film having a higher modulus than the one or more exposed top surface portions; or the bottom surface of the film being more texturized than the one or more exposed top surface portions.

In some examples, the one or more exposed top surface portions of the top surface of the film exhibit a holding force on stainless steel as per ASTM D1000 of less than 1.0 ounce per inch (less than 11 g/cm).

In some examples, the one or more exposed top surface portions do not include push-out holes.

A tape and reel carrier device also is provided. The carrier device comprises (a) a carrier. The carrier device also comprises (b) a reel.

In accordance with the carrier device, the carrier is a carrier as described above. Thus, the carrier comprises (a) a frame having a major axis, a top surface, a bottom surface, and one or more openings through the frame along the major axis. The carrier also comprises (b) a film comprising a thermoplastic elastomer material and having a top surface and a bottom surface. The film is attached to the frame based on thermal bonding of the top surface of the film to the bottom surface of the frame, is under tension along the major axis of the frame, and is free to flex at the one or more openings through the frame. The top surface of the film comprises one or more exposed top surface portions that are accessible through the one or more openings through the frame. The one or more exposed top surface portions exhibit a holding force on stainless steel as per ASTM D1000 that is greater than that of the bottom surface of the film.

Also in accordance with the carrier device, the carrier can embody the various examples of the carrier as described above. Thus, for example, in some examples the frame has a width of 6.0 to 60 mm, the frame has a thickness of 0.10 to 5.0 mm, the one or more openings each have an opening area of 2.0 to 1,100 mm$^2$, and/or the one or more openings, as seen from a top view, have a square shape, a rectangular shape, a circular shape, or an oval shape. Also in some examples, the frame comprises a plastic material, and in some of these examples, the frame further comprises an additive that provides electrostatic discharge properties. Also in some examples, the frame further has sprocket holes along the major axis of the frame. Also in some examples, the film has a thickness of 0.00050 to 0.010 inches (0.013 to 0.25 mm), the thermal bonding comprises melting the top surface of the film to the bottom surface of the frame, the film is attached to the frame without use of adhesive or bonding agent, and/or the one or more exposed top surface portions are unsupported. Also in some examples, the thermoplastic elastomeric material of the film comprises one or more of thermoplastic urethane (TPU), thermoplastic co-polyesters (COPE), thermoplastic co-polyamides (COPA), thermoplastic olefin elastomer (e.g. copolymer of ethylene with one or more of propylene, butene, or octene), styrene-ethylene-butylene-styrene (SEBS), styrene-ethylene-propylene-styrene (SEPS), styrene-ethylene-ethylene-butylene-styrene (SEEBS), styrene-butadiene-styrene (SBS), styrene-isoprene-styrene (SIS), styrene-isobutylene-styrene (SIBS), poly(methyl methacrylate)-b-poly(n-butyl acrylate)-b-poly(methyl methacrylate) (PMMA-b-PnBA-b-PMMA), or ethylene vinyl acetate (EVA). Also in some examples, the film further comprises one or more of a plasticizer, a reinforcing plastic, or an antioxidant, and/or the film further comprises an additive that provides electrostatic discharge properties.

Also in some examples, the film is substantially free of silicone, and/or the film is substantially free of adhesive. Also in some examples, the film exhibits one or more of the following properties: hysteresis of less than 9% when stretched up to 100%; elongation of greater than 400% at break; a tan Δ of less than 0.2 at room temperature (20° C.) when measured at 1 hertz; a primary $T_g$ lower than −20° C. when measured at 1 hertz; a Shore A durometer of less than 75 A; or a number average molecular weight ($M_n$) of a primary elastomer molecule of the thermoplastic elastomer material in final form being greater than 50,000 daltons. Also in some examples, the film has a one-layer structure, a two-layer structure, or a three-layer structure as described above. Also in some examples, the one or more exposed top surface portions exhibit a holding force on stainless steel as per ASTM D1000 that is greater than that of the bottom surface of the film based on one or more of: the bottom surface of the film having a higher modulus than the one or more exposed top surface portions; or the bottom surface of the film being more texturized than the one or more exposed top surface portions. Also in some examples, the one or more exposed top surface portions of the top surface of the film exhibit a holding force on stainless steel as per ASTM D1000 of less than 1.0 ounce per inch (less than 11 g/cm). Also in some examples, the one or more exposed top surface portions do not include push-out holes.

Also in accordance with the carrier device, the carrier is a tape, and the carrier is wound around the reel.

In some examples, the tape and reel carrier device further comprises one or more objects reversibly immobilized on the one or more exposed top surface portions of the top surface of the film of the carrier. In some of these examples, the one or more objects are reversibly immobilized based on the one or more exposed top surface portions conforming to a shape of the one or more objects. Also in some of these examples, the one or more exposed top surface portions each have an exposed surface area, and the one or more objects that are reversibly immobilized occupy 70% of the exposed surface area. Also in some of these examples, the one or more objects are reversibly immobilized on the one or more exposed top surface portions at an average frequency of less than or equal to one of the objects per exposed top surface portion. Also in some of these examples, the one or more objects are reversibly immobilized on the one or more exposed top surface portions at an average frequency of greater than one of the objects per exposed top surface portion. Also in some of these examples, the one or more objects comprise one or more of an electronic component, a wafer, a semiconductor material wafer, a silicon wafer, an integrated circuit wafer, a die, a semiconductor material die, a silicon die, an integrated circuit die, a photonic component, a photodiode component, a light emitting diode component, a pharmaceutical product, a pharmaceutical pill, a pharmaceutical capsule, a crystalline material object, or a jewel.

In some examples, the tape and reel carrier device further comprises a cover tape having a top surface and a bottom surface, wherein the bottom surface of the cover tape is reversibly attached to the top surface of the frame.

A method of use of a carrier for reversibly immobilizing one or more objects to the carrier also is provided.

In accordance with the method of use, the carrier is a carrier as described above. Thus, the carrier comprises (a) a frame having a major axis, a top surface, a bottom surface, and one or more openings through the frame along the major axis. The carrier also comprises (b) a film comprising a thermoplastic elastomer material and having a top surface and a bottom surface. The film is attached to the frame based on thermal bonding of the top surface of the film to the bottom surface of the frame, is under tension along the major axis of the frame, and is free to flex at the one or more openings through the frame. The top surface of the film comprises one or more exposed top surface portions that are accessible through the one or more openings through the frame. The one or more exposed top surface portions exhibit a holding force on stainless steel as per ASTM D1000 that is greater than that of the bottom surface of the film.

Also in accordance with the method of use, the carrier can embody the various examples of the carrier as described above. Thus, for example, in some examples the frame has a width of 6.0 to 60 mm, the frame has a thickness of 0.10 to 5.0 mm, the one or more openings each have an opening area of 2.0 to 1,100 mm², and/or the one or more openings, as seen from a top view, have a square shape, a rectangular shape, a circular shape, or an oval shape. Also in some examples, the frame comprises a plastic material, and in some of these examples, the frame further comprises an additive that provides electrostatic discharge properties. Also in some examples, the frame further has sprocket holes along the major axis of the frame. Also in some examples, the film has a thickness of 0.00050 to 0.010 inches (0.013 to 0.25 mm), the thermal bonding comprises melting the top surface of the film to the bottom surface of the frame, the film is attached to the frame without use of adhesive or bonding agent, and/or the one or more exposed top surface portions are unsupported. Also in some examples, the thermoplastic elastomeric material of the film comprises one or more of thermoplastic urethane (TPU), thermoplastic co-polyesters (COPE), thermoplastic co-polyamides (COPA), thermoplastic olefin elastomer (e.g. copolymer of ethylene with one or more of propylene, butene, or octene), styrene-ethylene-butylene-styrene (SEBS), styrene-ethylene-propylene-styrene (SEPS), styrene-ethylene-ethylene-butylene-styrene (SEEBS), styrene-butadiene-styrene (SBS), styrene-isoprene-styrene (SIS), styrene-isobutylene-styrene (SIBS), poly(methyl methacrylate)-b-poly(n-butyl acrylate)-b-poly (methyl methacrylate) (PMMA-b-PnBA-b-PMMA), or ethylene vinyl acetate (EVA). Also in some examples, the film further comprises one or more of a plasticizer, a reinforcing plastic, or an antioxidant, and/or the film further comprises an additive that provides electrostatic discharge properties. Also in some examples, the film is substantially free of silicone, and/or the film is substantially free of adhesive. Also in some examples, the film exhibits one or more of the following properties: hysteresis of less than 9% when stretched up to 100%; elongation of greater than 400% at break; a tan Δ of less than 0.2 at room temperature (20° C.) when measured at 1 hertz; a primary $T_g$ lower than −20° C. when measured at 1 hertz; a Shore A durometer of less than 75 A; or a number average molecular weight ($M_n$) of a primary elastomer molecule of the thermoplastic elastomer material in final form being greater than 50,000 daltons. Also in some examples, the film has a one-layer structure, a two-layer structure, or a three-layer structure as described above. Also in some examples, the one or more exposed top surface portions exhibit a holding force on stainless steel as per ASTM D1000 that is greater than that of the bottom surface of the film based on one or more of: the bottom surface of the film having a higher modulus than the one or more exposed top surface portions; or the bottom surface of the film being more texturized than the one or more exposed top surface portions. Also in some examples, the one or more exposed top surface portions of the top surface of the film exhibit a holding force on stainless steel as per ASTM D1000 of less than 1.0 ounce per inch (less than 11 g/cm).

Also in some examples, the one or more exposed top surface portions do not include push-out holes.

The method of use comprises a step of: (1) placing one or more objects on the one or more exposed top surface portions of the top surface of the film of the carrier, thereby reversibly immobilizing the one or more objects to the carrier.

In some examples, the one or more objects are reversibly immobilized based on the one or more exposed top surface portions conforming to a shape of the one or more objects. In some examples, the one or more exposed top surface portions each have an exposed surface area, and the one or more objects that are reversibly immobilized occupy ≤70% of the exposed surface area. Thus, in some examples, the one or more objects are reversibly immobilized based on the one or more exposed top surface portions conforming to a shape of the one or more objects, and the one or more exposed top surface portions each have an exposed surface area, and the one or more objects that are reversibly immobilized occupy ≤70% of the exposed surface area.

In some examples, one of the objects is reversibly immobilized per exposed top surface portion. In some examples, two or more of the objects are reversibly immobilized per exposed top surface portion.

In some examples, the one or more objects comprise one or more of an electronic component, a wafer, a semiconductor material wafer, a silicon wafer, an integrated circuit wafer, a die, a semiconductor material die, a silicon die, an integrated circuit die, a photonic component, a photodiode component, a light emitting diode component, a pharmaceutical product, a pharmaceutical pill, a pharmaceutical capsule, a crystalline material object, or a jewel.

In some examples, the method of use further comprises a step of: (2) applying a cover tape having a top surface and a bottom surface to the carrier, wherein the bottom surface of the cover tape is reversibly attached to the top surface of the frame. In some of these examples, the method further comprises steps of: (0) unwinding the carrier from a reel; and (3) winding the carrier around a reel. In some of these examples, the method of use further still comprises steps of: (4) unwinding the carrier from a reel; (5) removing the cover tape from the carrier; and (6) removing the one or more objects from the carrier. In some of these examples, the removing of the one or more objects from the carrier is accomplished by picking the one or more objects from the carrier.

In some examples, the carrier is used during one or more of a manufacturing process or a transportation process.

A method of making a carrier also is provided.

In accordance with the method of making, the carrier is a carrier as described above. Thus, the carrier comprises (a) a frame having a major axis, a top surface, a bottom surface, and one or more openings through the frame along the major axis. The carrier also comprises (b) a film comprising a thermoplastic elastomer material and having a top surface and a bottom surface. The film is attached to the frame based on thermal bonding of the top surface of the film to the bottom surface of the frame, is under tension along the major axis of the frame, and is free to flex at the one or more openings through the frame. The top surface of the film comprises one or more exposed top surface portions that are accessible through the one or more openings through the frame. The one or more exposed top surface portions exhibit a holding force on stainless steel as per ASTM D1000 that is greater than that of the bottom surface of the film.

Also in accordance with the method of making, the carrier can embody the various examples of the carrier as described above. Thus, for example, in some examples the frame has a width of 6.0 to 60 mm, the frame has a thickness of 0.10 to 5.0 mm, the one or more openings each have an opening area of 2.0 to 1,100 mm$^2$, and/or the one or more openings, as seen from a top view, have a square shape, a rectangular shape, a circular shape, or an oval shape. Also in some examples, the frame comprises a plastic material, and in some of these examples, the frame further comprises an additive that provides electrostatic discharge properties. Also in some examples, the frame further has sprocket holes along the major axis of the frame. Also in some examples, the film has a thickness of 0.00050 to 0.010 inches (0.013 to 0.25 mm), the thermal bonding comprises melting the top surface of the film to the bottom surface of the frame, the film is attached to the frame without use of adhesive or bonding agent, and/or the one or more exposed top surface portions are unsupported. Also in some examples, the thermoplastic elastomeric material of the film comprises one or more of thermoplastic urethane (TPU), thermoplastic co-polyesters (COPE), thermoplastic co-polyamides (COPA), thermoplastic olefin elastomer (e.g. copolymer of ethylene with one or more of propylene, butene, or octene), styrene-ethylene-butylene-styrene (SEBS), styrene-ethylene-propylene-styrene (SEPS), styrene-ethylene-ethylene-butylene-styrene (SEEBS), styrene-butadiene-styrene (SBS), styrene-isoprene-styrene (SIS), styrene-isobutylene-styrene (SIBS), poly(methyl methacrylate)-b-poly(n-butyl acrylate)-b-poly(methyl methacrylate) (PMMA-b-PnBA-b-PMMA), or ethylene vinyl acetate (EVA). Also in some examples, the film further comprises one or more of a plasticizer, a reinforcing plastic, or an antioxidant, and/or the film further comprises an additive that provides electrostatic discharge properties. Also in some examples, the film is substantially free of silicone, and/or the film is substantially free of adhesive. Also in some examples, the film exhibits one or more of the following properties: hysteresis of less than 9% when stretched up to 100%; elongation of greater than 400% at break; a tan Δ of less than 0.2 at room temperature (20° C.) when measured at 1 hertz; a primary $T_g$ lower than −20° C. when measured at 1 hertz; a Shore A durometer of less than 75 A; or a number average molecular weight ($M_n$) of a primary elastomer molecule of the thermoplastic elastomer material in final form being greater than 50,000 daltons. Also in some examples, the film has a one-layer structure, a two-layer structure, or a three-layer structure as described above. Also in some examples, the one or more exposed top surface portions exhibit a holding force on stainless steel as per ASTM D1000 that is greater than that of the bottom surface of the film based on one or more of: the bottom surface of the film having a higher modulus than the one or more exposed top surface portions; or the bottom surface of the film being more texturized than the one or more exposed top surface portions. Also in some examples, the one or more exposed top surface portions of the top surface of the film exhibit a holding force on stainless steel as per ASTM D1000 of less than 1.0 ounce per inch (less than 11 g/cm). Also in some examples, the one or more exposed top surface portions do not include push-out holes.

The method of making comprises a step of: (1) extruding a film extrusion composition comprising the thermoplastic elastomer material onto the frame, thereby forming the film. The film becomes attached to the frame during the extruding based on thermal bonding, thereby forming the carrier.

In some examples, the extruding is accomplished by use of a melt flex-lip extrusion die. In some examples, the thermal bonding comprises melting the top surface of the film to the bottom surface of the frame. In some examples, the film is attached to the frame without use of adhesive or bonding agent. Thus, in some examples, the extruding is accomplished by use of a melt flex-lip extrusion die, the thermal bonding comprises melting the top surface of the film to the bottom surface of the frame, and/or the film is attached to the frame without use of adhesive or bonding agent.

In some examples, the extruding comprises moving the frame at a first velocity, and forming the film at a second velocity, the first velocity being greater than the second velocity, the film thereby being under tension along the major axis of the frame upon attachment to the frame.

In some examples, the method of making further comprises a step of: (2) punching sprocket holes in the frame, along the major axis of the frame. In some examples, the method of making further comprises a step of: (3) winding the carrier around a reel.

BRIEF DESCRIPTION OF THE DRAWINGS

These and other features, aspects, and advantages of the present disclosure are better understood when the following detailed description is read with reference to the accompanying drawings, in which.

DETAILED DESCRIPTION OF THE INVENTION

Figure 1:
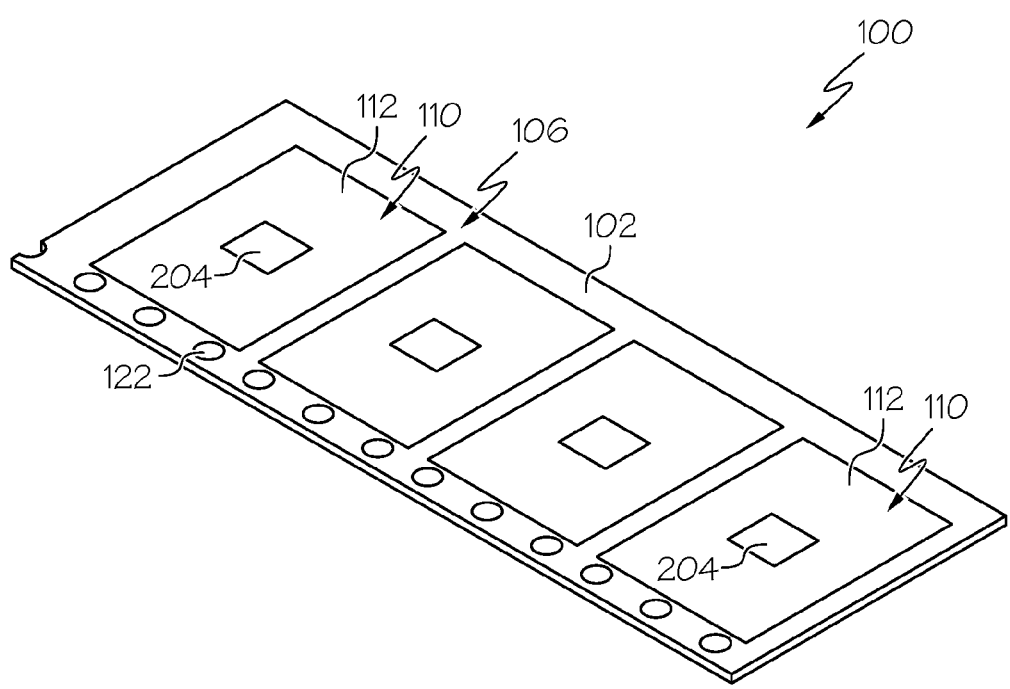
FIG. 1 illustrates a perspective view of a carrier according to the present disclosure, in which objects are shown reversibly immobilized on exposed top surface portions of a top surface of a film of the carrier.
Figure 2:
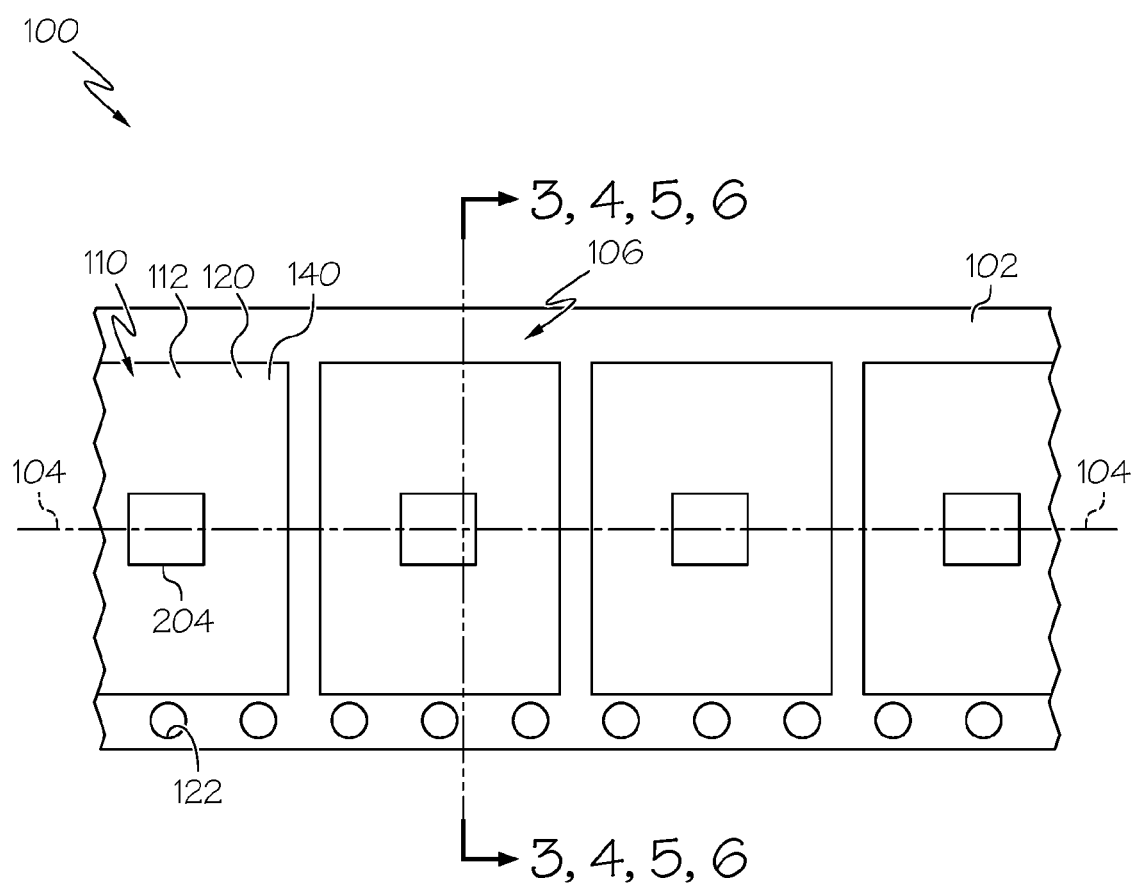
FIG. 2 is a top plan view of the carrier of FIG. 1.
Figure 3:
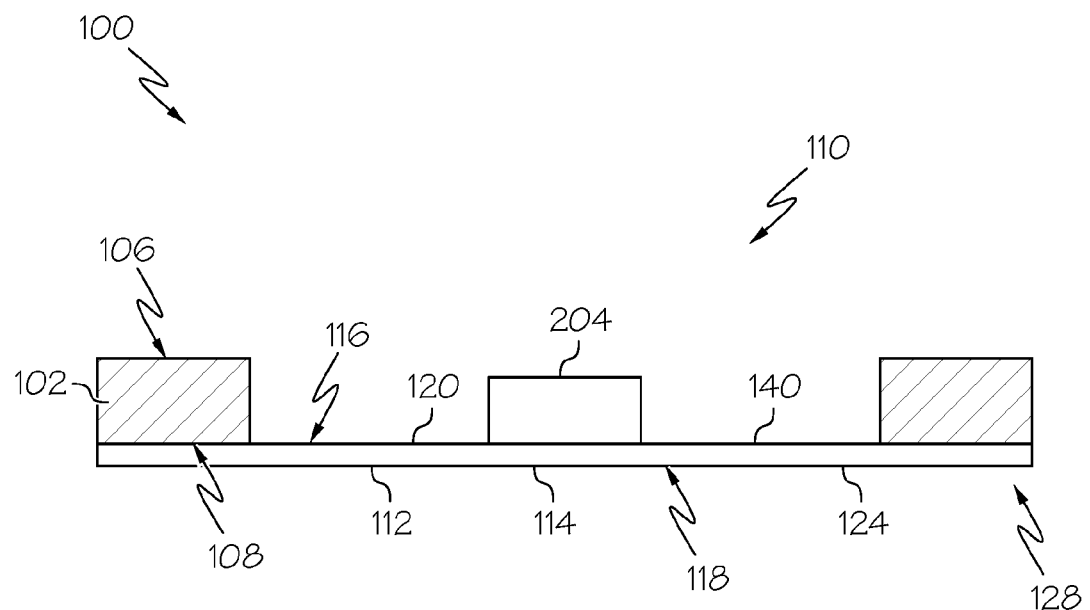
FIG. 3 is a sectional view of an embodiment of the carrier of FIG. 2, wherein the carrier comprises a film having a one-layer structure.

With reference to FIGS. 1-3, a carrier 100 for reversibly immobilizing one or more objects is provided. The carrier 100 comprises (a) a frame 102 having a major axis 104, a top surface 106, a bottom surface 108, and one or more openings 110 through the frame 102 along the major axis 104. The carrier 100 also comprises (b) a film 112 comprising a thermoplastic elastomer material 114 and having a top surface 116 and a bottom surface 118. The film 112 is attached to the frame 102 based on thermal bonding of the top surface 116 of the film 112 to the bottom surface 108 of the frame 102, is under tension along the major axis 104 of the frame 102, and is free to flex at the one or more openings 110 through the frame 102. The top surface 116 of the film 112 comprises one or more exposed top surface portions 120 that are accessible through the one or more openings 110 through the frame 102. The one or more exposed top surface portions 120 exhibit a holding force on stainless steel as per ASTM D1000 that is greater than that of the bottom surface 118 of the film 112.

The carrier 100 can be used advantageously for reversibly immobilizing one or more objects by placing the objects through the one or more openings 110 through the frame 102, onto the one or more exposed top surface portions 120 of the film 112 that are accessible through the openings 110 through the frame 102. As explained in detail below, because the film 112 is attached to the frame 102 based on thermal bonding of the top surface 116 of the film 112 to the bottom surface 108 of the frame 102, the film 112 forms a pocket of unsupported film at each of the openings 110. The objects can be immobilized reversibly on the exposed top surface portions 120 of the film 112 based on contact between the objects and the exposed top surface portions 120, due to the film 112 comprising the thermoplastic elastomer material 114, which provides the exposed top surface portions 120 with a tack that is sufficiently high to immobilize the objects on the exposed top surface portions 120, but sufficiently low to allow easy picking, e.g. vacuum picking and/or peeling, of the objects from the exposed top surface portions 120, and thus release of the objects. Based on how the immobilization and release are accomplished, a carrier 100 can be designed to carry a diverse range of objects of various sizes and shapes simply by dimensioning the openings 110 of the frame 102 of the carrier 100 to have an area sufficiently large to fit any of the various objects to be carried. The carrier 100 thus can be provided as a "universal" carrier, avoiding the need to design and/or use different carriers for carrying objects of different sizes and shapes, i.e. avoiding the need for customization of a carrier for each object to be carried, and providing savings of time and cost, improved efficiency, and increased productivity. Also based on how the immobilization and release are accomplished, the carrier 100 can be used to carry more than one object per exposed top surface portion 120, i.e. more than one object per pocket of unsupported film at each opening 110, without rattling or damage to the objects, also providing improved efficiency.

Use of a film 112 comprising a thermoplastic elastomer material 114 provides advantages in this context, relative to use of an adhesive, based on differences between surface tack exhibited by thermoplastic elastomers versus adhesives. Tack may be considered as a measure of resistance to separation. Thermoplastic elastomers exhibit very low levels of surface tack in comparison to adhesives, because adhesives are generally formulated to include tackifying agents, e.g. up to 50% by weight, whereas thermoplastic elastomers are not. Indeed, for thermoplastic elastomers surface tack is generally so low that the surface tack does not offer any functional performance for commercial applications. Generally, for thermoplastic elastomer applications tack is an undesirable property. Accordingly, thermoplastic elastomer surfaces are typically modified to entirely eliminate tack. This can be done, for example, by applying a lubricant, (e.g. for dynamic seals, gaskets, or cap liners comprising elastomers), by creating surface texturing (e.g. for reduced contact with surfaces of materials comprising elastomers), or applying de-tackifying agents (e.g. for latex gloves or diaper films comprising elastomers).

Considering thermoplastic elastomers and adhesives in more detail, thermoplastic elastomers are elastic and offer high elongation and low hysteresis, whereas adhesives are viscous by nature and offer neither high elongation nor low hysteresis. So that adhesives may bond to various surfaces, adhesives are made from low molecular weight polymers. This allows adhesives to flow and build adhesive bonds. In contrast, thermoplastic elastomers are made from high molecular weight polymers. Thermoplastic elastomers maintain their shape and elasticity, rather than flowing. Adhesives must have relatively low modulus (Dahlquist criterion) to function, but thermoplastic elastomers do not have such strict limitations on modulus. Thus, for example, an industry-standard adhesive has a surface tack on stainless steel as per ASTM D1000 of greater than 1 ounce/inch (greater than 11 g/cm), whereas a thermoplastic elastomer has a surface tack on stainless steel as per ASTM D1000 of less than 1 ounce/inch (less than 11 g/cm), e.g. of 0.20 to 0.90 ounces/inch (2.2 g/cm to 10 g/cm), 0.30 to 0.90 ounces/inch (3.3 g/cm to 10 g/cm), or 0.50 to 0.90 ounces/inch (5.6 g/cm to 10 g/cm).

For the carrier 100 as disclosed herein, providing the film 112 comprising the thermoplastic elastomer material 114 unsupported advantageously allows the thermoplastic elastomer material 114 to stretch during placement of objects, such as dies, onto the film 112, with the placement resulting in the film 112 conforming to the shape of the objects, and peeling of the objects from the film 112, with initiation of separation of the objects from the film 112 occurring along edges of the objects. In contrast to previous carrier tapes, in which the carrier tapes were provided with an adhesive that was supported either on a surface of an embossed cavity or on a film, for the carrier 100 as disclosed herein the thermoplastic elastomer material 114 is provided as a component of the film 112 itself. Surprisingly, it has been determined that a film 112 comprising a thermoplastic elastomer material 114 having the properties as disclosed herein, with the film 112 bonded to the frame 102 around the openings 110 through the frame 102, maintains sufficient mechanical strength for holding objects immobilized thereon, and remains intact during removal of the objects therefrom, e.g. without tearing. Thus the thermoplastic elastomer material 114 can be provided as a film 112 that is unsupported. Also in contrast to previous carrier tapes, in which adhesives were patterned to limit contact with objects, such as dies, to allow for peeling the objects from the tapes, for the carrier 100 as disclosed herein the objects can make full contact with the film 112 and thus with the thermoplastic elastomer material 114. Also in contrast to previous carrier tapes, particularly those in which embossed cavities were dimensioned to closely match the size and shape of the objects, such as dies, to be carried in the pockets, for the carrier 100 as disclosed herein the size of the openings 110 of the frame 102 can be maximized, being limited by the dimensions of the frame 102 rather than the size and shape of the objects. Indeed, the size of the openings 110 can be much greater than the size of the objects, and the openings 110 can have a uniform shape, e.g. a square or rectangular shape, independent of the shapes of the objects to be reversibly immobilized. Thus, the carrier 100 as disclosed herein can be used for reversibly immobilizing a diverse range of objects having diverse sizes and shapes.

Use of a film 112 comprising a thermoplastic elastomer material 114 also provides advantages relative to use of a silicone elastomer. A film 112 that comprises a thermoplastic elastomer material 114 and that is substantially free of silicone advantageously can have a low surface energy and no silicone residue, making the film 112 useful for carriers of objects that may experience negative chemical interactions with silicone.

Use of a film 112 comprising a thermoplastic elastomer material 114 also provides additional advantages relative to thermoset silicone-based materials and/or curable gels. This is because the film 112 comprising the thermoplastic elastomer material 114 is moldable using heat, allowing for easier manufacture relative to carrier tapes prepared using thermoset silicone-based materials or curable gels.

The carrier 100 thus can be used advantageously for reversibly immobilizing one or more objects, such as an electronic component, a wafer, a semiconductor material wafer, a silicon wafer, an integrated circuit wafer, a die, a semiconductor material die, a silicon die, an integrated circuit die, a photonic component, a photodiode component, a light emitting diode component, a pharmaceutical product, a pharmaceutical pill, a pharmaceutical capsule, a crystalline material object, or a jewel. The carrier 100 also can be used advantageously as a "universal" carrier, with the carrier 100 being designed to have openings 110 much larger than the size of a diverse range of objects that may be carried, and the carrier 100 then being suitable for carrying any of the diverse range of objects without need for customization of the carrier 100 with respect the diverse range of objects.

As noted, the carrier 100 comprises a frame 102 having a major axis 104, a top surface 106, a bottom surface 108, and one or more openings 110 through the frame 102 along the major axis 104. The frame 102 can have a length, a width, and a thickness, with the length corresponding to the major axis 104, and with the length being much greater than the width or the thickness.

The frame 102 can be sized for efficiently carrying the one or more objects. Thus, the frame 102 can be sufficiently wide and thick that the one or more objects can readily fit through the one or more openings 110 through the frame 102, to be reversibly immobilized on the one or more exposed top surface portions 120 of the top surface 116 of the film 112, and that the film 112 attached to the frame 102 can be maintained under tension. The frame 102 also is sufficiently narrow and thin that the frame 102 can flex while being driven by a sprocket wheel, e.g. spooled and/or unspooled, during use. In some examples the frame 102 has a width of 6.0 to 60 mm, for example 7.0 to 45 mm, or 8.0 to 32 mm. Also in some examples the frame 102 has a thickness of 0.10 to 5.0 mm, for example 0.15 to 3.0 mm, or 0.20 to 1.0 mm.

As noted, the one or more openings 110 are sized such that the one or more objects can readily fit through the one or more openings 110. This is based, for example, on opening area and shape of the one or more openings 110. As also noted, the size of the one or more openings 110 can be maximized, being limited by the dimensions of the frame 102 rather than the size and shape of the objects. For example, the openings 110 can be wider than the objects to be carried. In some examples, the one or more openings 110 each have an opening area of 2.0 to 1,100 mm$^2$, for example 3.0 to 700 mm$^2$, or 4.0 to 500 mm$^2$. Also, in some examples the one or more openings 110, as seen from a top view, have a square shape, a rectangular shape, a circular shape, or an oval shape. As will be appreciated, because the size of the one or more openings 110 can be maximized, opening areas greater than 1,100 m$^2$ and/or other shapes of the one or more openings 110 also can be suitable.

The one or more openings 110 can be distributed along the major axis 104 of the frame 102 uniformly and/or symmetrically. The one or more openings 110 also can have identical shapes. A uniform and/or symmetrical distribution of the one or more openings 110 and/or identical shapes of the one or more openings 110 advantageously can allow for ease of automation with respect to placement of objects through the one or more openings 110 through the frame 102, onto the one or more exposed top surface portions 120 of the top surface 116 of the film 112, and also picking, e.g. vacuum picking and/or peeling, of the objects therefrom.

The frame 100 can comprise one or more suitable materials. The one or more suitable materials can be selected to provide sufficient strength to support the film 112 on which the one or more objects will be reversibly immobilized, and sufficient flexibility to allow winding and unwinding of the frame 102, and thus the carrier 100, around a reel. Thus, in some examples the frame 102 comprises a plastic material. The plastic material can comprise, for example, one or more of polystyrene (PS), polycarbonate (PC), low density polyethylene (LDPE), high density polyethylene (HDPE), ethylene vinyl acetate (EVA), polypropylene, or an engineering plastic.

In some examples the frame 102 further comprises an additive that provides electrostatic discharge properties. Such an additive can advantageously protect objects to be carried from damage by electrostatic discharge while being carried. The additive that provides electrostatic discharge properties can comprise, for example, one or more of a carbon nanotube, carbon black, a carbon fiber, a conductive polymer, a conductive powder, a conductive fiber, a metal salt, a lithium salt, an antistatic additive, or a modified urethane.

The frame 102 can be configured to allow for driving of the frame 102 by a sprocket wheel, e.g. for winding and unwinding of the carrier 100, during use. Thus, in some examples the frame 102 further has sprocket holes 122 along the major axis 104 of the frame 102. In accordance with these examples, a sprocket wheel can engage with the sprocket holes 122 to drive movement of the frame 102.

As also noted, the carrier 100 also comprises a film 112 comprising a thermoplastic elastomer material 114 and having a top surface 116 and a bottom surface 118. The film 112 is attached to the frame 102 based on thermal bonding of the top surface 116 of the film 112 to the bottom surface 108 of the frame 102. Thermal bonding can be accomplished by melting the film 112 to the frame 102, and can provide for attachment of the film 112 to the frame 102 without need for use of adhesives. Suitable approaches for thermal bonding depend on the compositions of the film 112 and the frame 102, their dimensions, and how the thermal bonding is accomplished, among other factors, as will be understood by a person of skill in the art. The thermal bonding can be accomplished, for example, by extruding a film extrusion composition comprising the thermoplastic elastomer material 114 onto the frame 102, thereby forming the film 112, as discussed below. Such extruding can be accomplished, for example, by use of a melt flex-lip extrusion die, also as discussed below. In some examples, the thermal bonding comprises melting the top surface 116 of the film 112 to the bottom surface 108 of the frame 102. Also, in some examples the film 112 is attached to the frame 102 without use of adhesive or bonding agent.

The film 112 is under tension along the major axis 104 of the frame 102. Having the film 112 be under tension along the major axis 104 of the frame 102 advantageously allows the film 112 to stretch and conform to an object placed on the film 112, rather than being displaced by the object, ensuring substantial contact between the film 112 and the object. Having the film 112 be under tension also advantageously allows maintaining the position of the object with respect to the film 112 and the frame 102, rather than having the position of the object vary with movement of the film 112 relative to the frame 102. Having the film 112 be under tension also advantageously allows the object to be peeled from the film 112 easily by application of a pick force, e.g. a vacuum force, to the object and/or the film 112. The film 112 thus can be unsupported, such that no support needs to be provided below the bottom surface 118 of the film 112. The film 112 can be put under tension along the major axis 104 of the frame 102, for example, by extruding a film extrusion composition comprising the thermoplastic elastomer material 114 onto the frame 102, thereby forming the film 112, as discussed below, wherein the extruding comprises moving the frame 102 at a first velocity, and forming the film 112 at a second velocity, the first velocity being greater than the second velocity, the film 112 thereby being under tension along the major axis 104 of the frame 102 upon attachment to the frame 102. The first velocity can be, for example, 10 to 20 feet/min (3.0 to 6.1 m/min). The second velocity can be, for example, 5 to 10 feet/min (1.5 to 3.0 m/min).

In some examples, the one or more exposed top surface portions 120 are unsupported. As noted, because the film 112 is under tension along the major axis 104 of the frame 102, the film 112 can be unsupported. Thus, the one or more exposed top surface portions 120 also can be unsupported.

The film 112 is free to flex at the one or more openings 110 through the frame 102. Similarly to the one or more openings 110, the film 112 is sized such that the one or more objects can readily fit on the exposed top surface portions 120 of the film 112, i.e. the exposed top surface portions 120 are wider than the objects to be carried. Like the frame 102, the film 112 also is sufficiently narrow and thin that the film 112 can flex while the frame 102 is being driven by a sprocket wheel. Thus, in general the film 112 has a width that is greater than or equal to the width of the one or more openings 110 through the frame 102, and less than or equal to the width of the frame 102. Also, in some examples, the film 112 has a thickness of 0.00050 to 0.010 inches (0.013 to 0.25 mm), for example 0.00080 to 0.0070 inches (0.020 to 0.18 mm), or 0.0010 to 0.0050 inches (0.025 to 0.13 mm).

As noted, the film 112 comprises a thermoplastic elastomer material 114. In some examples, the thermoplastic elastomeric material 114 of the film 112 comprises one or more of thermoplastic urethane (TPU), thermoplastic co-polyesters (COPE), thermoplastic co-polyamides (COPA), thermoplastic olefin elastomer (e.g. copolymer of ethylene with one or more of propylene, butene, or octene), styrene-ethylene-butylene-styrene (SEBS), styrene-ethylene-propylene-styrene (SEPS), styrene-ethylene-ethylene-butylene-styrene (SEEBS), styrene-butadiene-styrene (SBS), styrene-isoprene-styrene (SIS), styrene-isobutylene-styrene (SIBS), poly(methyl methacrylate)-b-poly(n-butyl acrylate)-b-poly(methyl methacrylate) (PMMA-b-PnBA-b-PMMA), or ethylene vinyl acetate (EVA).

In some examples the film 112 further comprises one or more compounds to promote flexibility, strength, and/or stability of the film 112. In some examples, the film 112 further comprises one or more of a plasticizer (e.g. up to about 50%), a reinforcing plastic (e.g. up to about 30%), or an antioxidant (e.g. up to about 1%).

Like the frame 102, in some examples the film 112 further comprises an additive that provides electrostatic discharge properties. Like for the frame 102, the additive that can provide electrostatic discharge properties can comprise, for example, one or more of a carbon nanotube, carbon black, a carbon fiber, a conductive polymer, a conductive powder, a conductive fiber, a metal salt, a lithium salt, an antistatic additive, or a modified urethane.

In some examples the film 112 is substantially free of silicone. As noted above, a film 112 that comprises a thermoplastic elastomer material 114 and that is substantially free of silicone advantageously can have a low surface energy and no silicone residue, making the film 112 useful for a carrier 100 of objects that may experience negative chemical interactions with silicone, e.g. undesirable bonding and/or transference of silicone. By substantially free of silicone, it is meant that the film 112 comprises a silicone content, such as a silicone elastomer, at not more than 5.0 (wt/wt) %. For example, the film 112 may include silicone at 0 to 4.0 (wt/wt) %, 0 to 0.3 (wt/wt) %, 0 to 0.2 (wt/wt) %, 0 to 0.1 (wt/wt) %, 0 to 0.01 (wt/wt) %, or 0 to 0.001 (wt/wt) %. Also for example, the film 112 may be entirely free of silicone content, e.g. based on no silicone content having been used in formulating the film 112.

In some examples the film 112 is substantially free of adhesive. A film 112 that is substantially free of adhesive advantageously can be relatively tack-free as compared to an industry-standard adhesive, which is defined as having a peel force on stainless steel as per ASTM D1000 of greater than 1 ounce/inch (greater than 11 g/cm). Similarly as for silicone, by substantially free of adhesive, it is meant that the film 112 comprises an adhesive at not more than 5.0 (wt/wt) %. For example, the film 112 may include adhesive at 0 to 4.0 (wt/wt) %, 0 to 0.3 (wt/wt) %, 0 to 0.2 (wt/wt) %, 0 to 0.1 (wt/wt) %, 0 to 0.01 (wt/wt) %, or 0 to 0.001 (wt/wt) %. Also for example, the film 112 may be entirely free of adhesive, e.g. based on no adhesive having been used in formulating the film 112.

Also, in some examples the film 112 exhibits one or more of the following properties: hysteresis of less than 9% when stretched up to 100%; elongation of greater than 400% at break; a tan $\Delta$ of less than 0.2 at room temperature (20° C.) when measured at 1 hertz; a primary $T_g$ lower than −20° C. when measured at 1 hertz; a Shore A durometer of less than 75 A; or a number average molecular weight ($M_n$) of a primary elastomer molecule of the thermoplastic elastomer material in final form being greater than 50,000 daltons. These properties, individually and together, provide for a film 112 that can be used for reversibly immobilizing objects in a carrier 100. Thus, in some examples the film 112 exhibits at least two, at least three, at least four, at least five, or all six of these properties.

As noted above, the one or more exposed top surface portions 120 exhibit a holding force on stainless steel as per ASTM D1000 that is greater than that of the bottom surface 118 of the film 112. Measurement of the holding force can be made in accordance with ASTM D1000-17, corresponding to ASTM Designation D1000, "Standard Test Methods for Pressure-Sensitive Adhesive-Coated Tapes Used for Electrical and Electronic Applications," as revised in 2017, following the procedure for testing adhesion strength to steel in sections 46-53. The measurement can be made at room temperature, e.g. at 20° C. In some examples the one or more exposed top surface portions 120 exhibit a holding force on stainless steel as per ASTM D1000 that is greater than that of the bottom surface 118 of the film 112 based on one or more of: the bottom surface 118 of the film 112 having a higher modulus than the one or more exposed top surface portions 120; or the bottom surface 118 of the film 112 being more texturized than the one or more exposed top surface portions 120.

Figure 4:
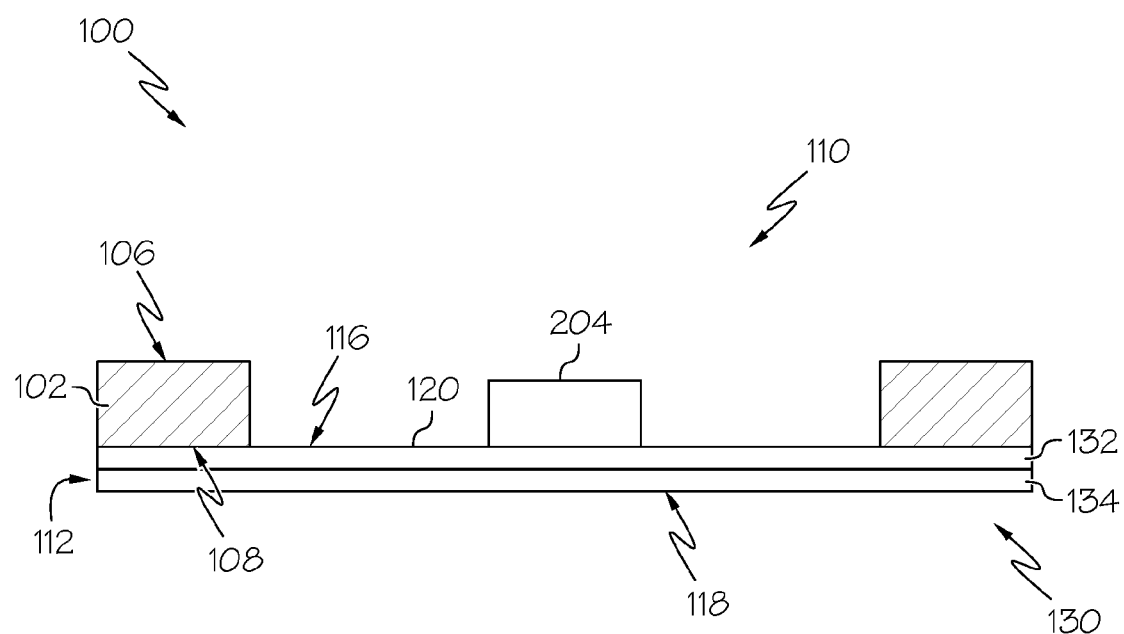
FIG. 4 is a sectional view of an embodiment of the carrier of FIG. 2, wherein the carrier comprises a film having a two-layer structure.
Figure 5:
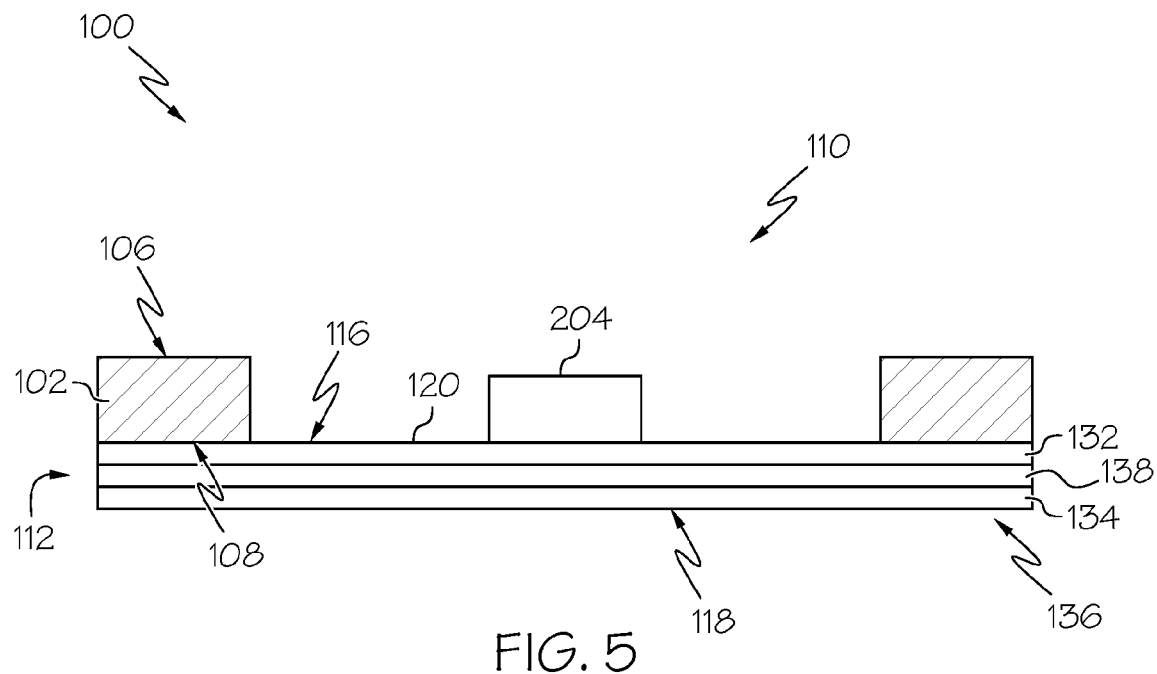
FIG. 5 is a sectional view of an embodiment of the carrier of FIG. 2, wherein the carrier comprises a film having a three-layer structure.
Figure 6:
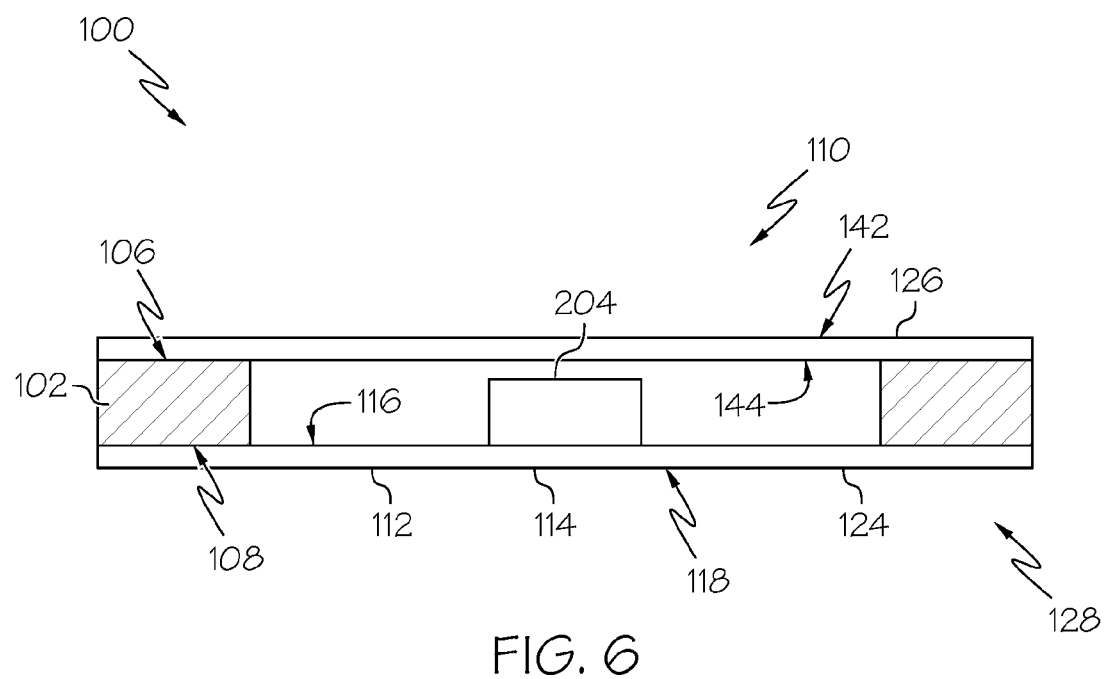
FIG. 6 is a sectional view of an embodiment of the carrier of FIG. 2, wherein the carrier comprises a film having a one-layer structure, and a cover tape is attached to the frame of the carrier.

As shown in FIGS. 3-5, also with reference to FIG. 1 and FIG. 2, the film 112 can be made to have structures including one or more layers 124, with the properties of the film 112 depending on the compositions of the one or more layers 124. As shown in FIG. 6, the film 112 particularly can be structured to advantageously prevent sticking, also termed wetting, of the bottom surface 118 of the film 112 to the top surface 106 of the frame 102 and/or a cover tape 126 attached to the top surface 106 of the frame 102 when the carrier 100 is wound and unwound.

Thus, with reference to FIG. 3, in some examples the film 112 has a one-layer structure 128 having a uniform composition. In accordance with these examples, the one or more exposed top surface portions 120 can exhibit a holding force on stainless steel as per ASTM D1000 that is greater than that of the bottom surface 118 of the film 112 based on the bottom surface 118 of the film 112 being more texturized than the one or more exposed top surface portions 120. For example, the bottom surface 118 of the film 112 can be texturized, e.g. roughened, stippled, etc., decreasing surface area of the bottom surface 118 of the film 112 that will contact the top surface 106 of the frame 102 and/or a cover tape 126 attached to the top surface 106 of the frame 102 when the carrier 100 is wound. This reduces the degree of sticking that may need to be overcome so that the carrier 100 may be unwound.

Also, with reference to FIG. 4, in some examples the film 112 has a two-layer structure 130 comprising a first layer 132 and an opposite second layer 134 attached to the first layer 132, the first layer 132 and the second layer 134 both having a uniform composition, the uniform composition of the first layer 132 being different than the uniform composition of the second layer 134. In accordance with these examples, the first layer 132 can provide the top surface 116 of the film 112, and thus the surface having the exposed top surface portions 120 to which the objects become reversibly immobilized. The second layer 134 can provide the bottom surface 118 of the film 112, and thus the surface that will contact the frame 102 and/or a cover tape 126 attached to the top surface 106 of the frame 102 when the carrier 100 is wound. In accordance with these examples, the exposed top surface portions 120 of the film 112 can exhibit a holding force on stainless steel as per ASTM D1000 that is greater than that of the bottom surface 118 of the film 112 based on the second layer 134 comprising a thermoplastic elastomer material 114 having a higher modulus and higher hardness than the first layer 132. This can ensure that no surface wetting of the frame 102 or a cover tape 126 will occur when the carrier 100 is wound about itself on a reel.

Also, with reference to FIG. 5, in some examples the film 112 has a three-layer structure 136 comprising a first layer 132, an opposite second layer 134, and a third layer 138 between the first layer 132 and the second layer 134, the third layer 138 bonding the first layer 132 and the second layer 134, the first layer 132 and the second layer 134 both having a uniform composition, the uniform composition of the first layer 132 being different than the uniform composition of the second layer 134. Similarly as for the film 112 having a two-layer structure 130, the first layer 132 can provide the top surface 116 of the film 112, the second layer 134 can provide the bottom surface 118 of the film 112, and the exposed top surface portions 120 of the film 112 can exhibit a holding force on stainless steel as per ASTM D1000 that is greater than that of the bottom surface 118 of the film 112 based on the second layer 134 comprising a thermoplastic elastomer material 114 having a higher modulus and higher hardness than the first layer 132. Again, this can ensure that no surface wetting of the frame 102 or a cover tape 126 will occur when the carrier 100 is wound about itself on a reel. The third layer 138 can be a tie layer, thereby bonding the first layer 132 and the second layer 134.

In some examples the one or more exposed top surface portions 120 of the top surface 116 of the film 112 exhibit a holding force on stainless steel as per ASTM D1000 of less than 1.0 ounce per inch (less than 11 g/cm), e.g. of 0.20 to 0.90 ounces/inch (2.2 g/cm to 10 g/cm), 0.30 to 0.90 ounces/inch (3.3 g/cm to 10 g/cm), or 0.50 to 0.90 ounces/inch (5.6 g/cm to 10 g/cm). Again, measurement of the holding force can be made in accordance with ASTM D1000-17, as discussed above. In accordance with these examples, the one or more exposed top surface portions 120 exhibit a holding force on stainless steel as per ASTM D1000 that is less than that of an industry-standard adhesive.

In some examples, the one or more exposed top surface portions 120 do not include push-out holes. Based on properties of the film 112 as discussed above, objects advantageously can be released from the film 112, and thus released from the carrier 100, simply by vacuum picking, without need for pushing, and thus without need for push-out holes in the exposed top surface portions 120. This is particularly advantageous for use of the carrier 100 for carrying objects, such as flip chip package designs, that are not amenable to being released by being pushed from the bottom surface 118 of the film 112, e.g. due to the orientation and/or delicateness of the objects.

In some examples, the film 112 exhibits a clarity sufficient for inspection by optical means. Optical properties of a film 112, such as gloss, transparency, haze, and refractive index, depend on the specific polymer, formulation, and crystallinity of materials from which the film 112 is made. Inspection by optical means can provide a rapid and efficient approach for confirming suitability of a particular composition or batch of a film 112.

Figure 7:
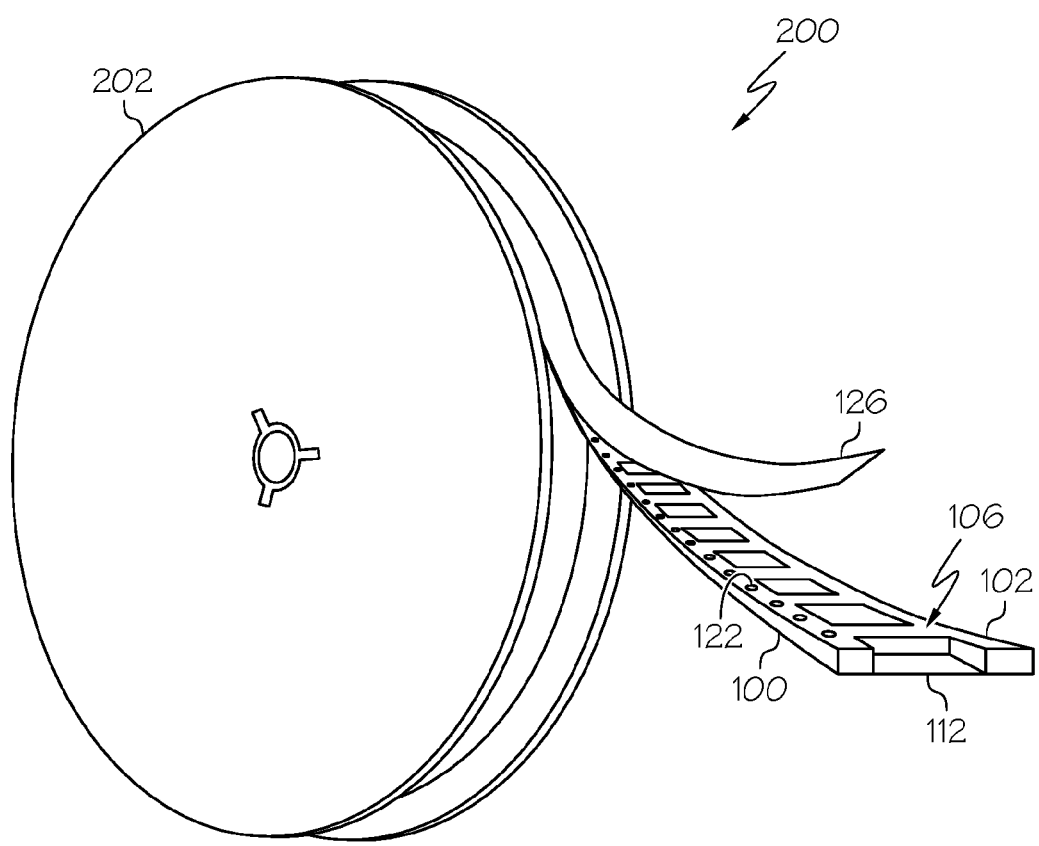
FIG. 7 illustrates a perspective view of a tape and reel carrier device, including a carrier according to the present disclosure.

A tape and reel carrier device 200 also is provided. As shown in FIG. 7, with reference to FIGS. 1-3, the tape and reel carrier device 200 comprises (a) a carrier 100 for reversibly immobilizing one or more objects, as described above. Thus, the carrier 100 comprises (a) a frame 102 having a major axis 104, a top surface 106, a bottom surface 108, and one or more openings 110 through the frame 102 along the major axis 104. The carrier 100 also comprises (b) a film 112 comprising a thermoplastic elastomer material 114 and having a top surface 116 and a bottom surface 118. The film 112 is attached to the frame 102 based on thermal bonding of the top surface 116 of the film 112 to the bottom surface 108 of the frame 102, is under tension along the major axis 104 of the frame 102, and is free to flex at the one or more openings 110 through the frame 102. The top surface 116 of the film 112 comprises one or more exposed top surface portions 120 that are accessible through the one or more openings 110 through the frame 102. The one or more exposed top surface portions 120 exhibit a holding force on stainless steel as per ASTM D1000 that is greater than that of the bottom surface 118 of the film 112.

The carrier 100 of the tape and reel carrier device 200 can embody the various examples of the carrier 100 as described above. Thus, for example, in some examples the frame 102 has a width of 6.0 to 60 mm, the frame 102 has a thickness of 0.10 to 5.0 mm, the one or more openings 110 each have an opening area of 2.0 to 1,100 mm$^2$, and/or the one or more openings 110, as seen from a top view, have a square shape, a rectangular shape, a circular shape, or an oval shape, among other examples of the carrier 100 as described above.

The tape and reel carrier device 200 also comprises (b) a reel 202. The reel 202 can comprise, for example, a cylindrical drum that can rotate about an axis. The reel 202 also can comprise, for example, a first flange and a second flange, the first flange being attached to the cylindrical drum at a first end of the cylindrical drum along the axis, and the second flange being attached to the cylindrical drum at a second end of the cylindrical drum along the axis.

In accordance with the tape and reel carrier device 200, the carrier 100 is a tape, and the carrier 100 is wound around the reel 202. For example, for a reel 202 that comprises a cylindrical drum, a first flange, and a second flange as described, the carrier 100 can be wound around the cylindrical drum, guided by the first flange and the second flange, such that the carrier 100 is positioned between the first flange and the second flange. This is advantageous, for example, for efficient shipment and/or storage of the carrier 100 before use. Thus, the reel 202 can be used for winding and unwinding the carrier 100.

The tape and reel carrier device 200 can be used advantageously for reversibly immobilizing one or more objects, as discussed above regarding the carrier 100. As discussed above, the reversible immobilization of the objects can be accomplished by placing the objects through the one or more openings 110 through the frame 102, onto the one or more exposed top surface portions 120 of the film 112 that are accessible through the one or more openings 110 through the frame 112. As discussed, because the film 112 is attached to the frame 102 based on thermal bonding of the top surface 116 of the film 112 to the bottom surface 108 of the frame 102, the film 112 forms a pocket of unsupported film at each of the openings 110. The objects can be immobilized reversibly on the exposed top surface portions 120 of the film 112 based on contact between the objects and the exposed top surface portions 120, due to the film 112 comprising the thermoplastic elastomer material 114, which provides the exposed top surface portions 120 with a tack that is sufficiently high to immobilize the objects on the exposed top surface portions 120, but sufficiently low to allow easy picking, e.g. vacuum picking and/or peeling, of the objects from the exposed top surface portions 120, and thus release of the objects. Again, based on how the immobilization and release are accomplished, the carrier 100 can be designed to carry a diverse range of objects of various sizes and shapes simply by dimensioning the openings 110 of the frame 102 of the carrier 100 to have an area sufficiently large to fit any of the various objects to be carried. The carrier 100 thus can be provided as a "universal" carrier. The carrier 100 also can be used to carry more than one object per exposed top surface portion 120.

The reel 202 can have a reel diameter that is suitable for winding a substantial length of the carrier 100. For example, for a reel 202 that comprises a cylindrical drum, a first flange, and a second flange as described, the reel 202 can have a cylindrical drum diameter of 30 to 200 mm, 40 to 170 mm, or 50 to 130 mm. Also for example, the reel 202 can have a flange diameter of 100 to 600 mm, 130 to 500 mm, or 160 to 400 mm. In some examples the reel 202 can have a flange diameter consistent with industry standards for tape and reel applications, such as 178 mm or 330 mm. The reel 202 also can have a width between the first flange and the second flange that is suitable for fitting the carrier 100. For example, the reel 202 can have a width between the first flange and the second flange that is greater than or equal to the width of the frame 102 of the carrier 100. Other cylindrical drum diameters, flange diameters, and/or widths between the first flange and the second flange also can be suitable.

The reel 202 can be made from any of a variety of materials suitable for supporting the carrier 100. For example, the reel 202 can be made from polystyrene, among other suitable materials.

In some examples, the tape and reel carrier device 200 further comprises one or more objects 204 reversibly immobilized on the one or more exposed top surface portions 120 of the top surface 116 of the film 112 of the carrier 100. The tape and reel carrier device 200 can comprise the one or more objects 204, for example, during use of the tape and reel carrier device 200 for carrying the one or more objects 204.

In some of these examples, the one or more objects 204 are reversibly immobilized based on the one or more exposed top surface portions 120 conforming to a shape of the one or more objects 204. As noted, the film 112 comprises a thermoplastic elastomer material 114. As also noted, the film 112 is attached to the frame 102 based on thermal bonding of the top surface 116 of the film 112 to the bottom surface 108 of the frame 102, is under tension along the major axis 104 of the frame 102, and is free to flex at the one or more openings 110 through the frame 102. As also noted, the objects 204 can be immobilized on the exposed top surface portions 120 based on contact between the objects 204 and the exposed top surface portions 120, due to the film 112 comprising the thermoplastic elastomer material 114, which provides the exposed top surface portions 120 with a tack that is sufficiently high to immobilize the objects 124. By conforming to the shape of the one or more objects 204, the film 112 can advantageously reversibly immobilize objects having surfaces with diverse contours, such as, for examples, flat surfaces, rounded surfaces, angular surfaces, or irregular surfaces, among others, without need for adjusting properties of the film 112 to match particular contours of surfaces of particular objects to be carried.

Also in some of these examples, the one or more exposed top surface portions 120 each have an exposed surface area 140, and the one or more objects 204 that are reversibly immobilized occupy 70% of the exposed surface area 140. Maintaining a portion of the exposed surface area 140, e.g. at least 30%, as unoccupied with respect to the one or more objects 204 during use advantageously allows the thermoplastic elastomer material 114 of the corresponding film 112 to stretch easily during peeling of the one or more objects 204 from the film 112, thus allowing for easy and complete release of the one or more objects 204 from the film 112. Thus, in some examples the one or more objects 204 that are reversibly immobilized occupy ≤60%, ≤50%, ≤40%, ≤30%, ≤20%, ≤10%, or ≤5% of the exposed surface area 140.

Also in some of these examples, the one or more objects 204 are reversibly immobilized on the one or more exposed top surface portions 120 at an average frequency of less than or equal to one of the objects per exposed top surface portion 120. For example the tape and reel carrier device 200 can be used to carry one object per exposed top surface portion 120, and thus one object per opening 110.

Also in some of these examples, the one or more objects 204 are reversibly immobilized on the one or more exposed top surface portions 120 at an average frequency of greater than one of the objects per exposed top surface portion 120. For example the tape and reel carrier device 200 can be used to carry two, three, or more objects per exposed top surface portion 120, and thus two, three, or more objects per opening 110.

In some of these examples, the one or more objects 204 comprise one or more of an electronic component, a wafer, a semiconductor material wafer, a silicon wafer, an integrated circuit wafer, a die, a semiconductor material die, a silicon die, an integrated circuit die, a photonic component, a photodiode component, a light emitting diode component, a pharmaceutical product, a pharmaceutical pill, a pharmaceutical capsule, a crystalline material object, or a jewel.

As shown in FIG. 7, with reference to FIG. 6, in some examples, the tape and reel carrier device 200 further comprises a cover tape 126 having a top surface 142 and a bottom surface 144, wherein the bottom surface 144 of the cover tape 126 is reversibly attached to the top surface 106 of the frame 102. A cover tape 126, used in combination with the carrier 100 as disclosed herein, can advantageously secure objects reversibly immobilized on the exposed top surface portions 120 of the film 112.

The tape and reel carrier device 200 can be, for example, an in-process carrier device or a transportation carrier device. As will be understood by those of skill in the art, in-process carriers are used for handling and storing objects, such as dies, during a manufacturing process, whereas transportation carriers are used for physical movement of objects, particularly fragile ones. The tape and reel carrier device 200 can be, for example, an in-process carrier used in disk drive lapping. The tape and reel carrier device 200 also can be, for example, a transportation carrier for physical movement of any of the various objects noted above, namely an electronic component, a wafer, a semiconductor material wafer, a silicon wafer, an integrated circuit wafer, a die, a semiconductor material die, a silicon die, an integrated circuit die, a photonic component, a photodiode component, a light emitting diode component, a pharmaceutical product, a pharmaceutical pill, a pharmaceutical capsule, a crystalline material object, or a jewel.

An in-process carrier or a transportation carrier comprising the tape and reel carrier device 200 advantageously has the ability to maintain orientation of fragile objects. For in-process carriers in particular, this allows ease of use of the carriers in manufacturing processes. For transportation carriers, this facilitates shipping and handling of fragile objects, particularly fragile objects that cannot be shipped by other means without damaging the fragile objects. In addition, for an in-process carrier or a transportation carrier comprising the tape and reel carrier device 200 used for consumer purposes, such as shipping and handling of an object such as fine jewelry, the tape and reel carrier device 200 has the capacity to enhance visual presentation of objects by maintaining the objects in a set position within the carrier 100 throughout periods of shipping and handling.

A method of use of a carrier for reversibly immobilizing one or more objects to the carrier also is disclosed. With reference to FIGS. 1-3, the carrier is a carrier 100 for reversibly immobilizing one or more objects, as described above. Thus, the carrier 100 comprises (a) a frame 102 having a major axis 104, a top surface 106, a bottom surface 108, and one or more openings 110 through the frame 102 along the major axis 104. The carrier 100 also comprises (b) a film 112 comprising a thermoplastic elastomer material 114 and having a top surface 116 and a bottom surface 118. The film 112 is attached to the frame 102 based on thermal bonding of the top surface 116 of the film 112 to the bottom surface 108 of the frame 102, is under tension along the major axis 104 of the frame 102, and is free to flex at the one or more openings 110 through the frame 102. The top surface 116 of the film 112 comprises one or more exposed top surface portions 120 that are accessible through the one or more openings 110 through the frame 102. The one or more exposed top surface portions 120 exhibit a holding force on stainless steel as per ASTM D1000 that is greater than that of the bottom surface 118 of the film 112.

The carrier 100 of the method of use can embody the various examples of the carrier 100 as described above.

Thus, for example, in some examples the frame 102 has a width of 6.0 to 60 mm, the frame 102 has a thickness of 0.10 to 5.0 mm, the one or more openings 110 each have an opening area of 2.0 to 1,100 mm$^2$, and/or the one or more openings 110, as seen from a top view, have a square shape, a rectangular shape, a circular shape, or an oval shape, among other examples of the carrier 100 as described above.

The method of use of the carrier comprises a step of: (1) placing one or more objects 204 on the one or more exposed top surface portions 120 of the top surface 116 of the film 112 of the carrier 100, thereby reversibly immobilizing the one or more objects 204 to the carrier 100. The method can be used advantageously for reversibly immobilizing one or more objects 204, as discussed above regarding the carrier 100.

In some examples, the one or more objects 204 are reversibly immobilized based on the one or more exposed top surface portions 120 conforming to a shape of the one or more objects 204. As discussed above, by conforming to the shape of the one or more objects 204, the film 112 can advantageously reversibly immobilize objects having surfaces with diverse contours, without need for adjusting properties of the film 112 to match particular contours of surfaces of particular objects to be carried.

In some examples, the one or more exposed top surface portions 120 each have an exposed surface area 140, and the one or more objects 204 that are reversibly immobilized occupy 70% of the exposed surface area 140. As also discussed, maintaining a portion of the exposed surface area 140, e.g. at least 30%, as unoccupied with respect to the one or more objects 204 during use advantageously allows the thermoplastic elastomer material 114 of the corresponding film 112 to stretch easily during peeling of the one or more objects 204 from the film 112. Thus, in some examples the one or more objects 204 that are reversibly immobilized occupy ≤60%, ≤50%, ≤40%, ≤30%, ≤20%, ≤10%, or ≤5% of the exposed surface area 140.

In some examples, one of the objects is reversibly immobilized per exposed top surface portion 120. In some examples, two or more of the objects are reversibly immobilized per exposed top surface portion 120.

In some examples, the one or more objects 204 comprise one or more of an electronic component, a wafer, a semiconductor material wafer, a silicon wafer, an integrated circuit wafer, a die, a semiconductor material die, a silicon die, an integrated circuit die, a photonic component, a photodiode component, a light emitting diode component, a pharmaceutical product, a pharmaceutical pill, a pharmaceutical capsule, a crystalline material object, or a jewel.

With reference to FIG. 6, as well as FIGS. 1-3, in some examples, the method of use further comprises a step of: (2) applying a cover tape 126 having a top surface 142 and a bottom surface 144 to the carrier 100, wherein the bottom surface 144 of the cover tape 126 is reversibly attached to the top surface 106 of the frame 102. As discussed, a cover tape 126, used in combination with the carrier 100 as disclosed herein, advantageously can secure objects reversibly immobilized on the exposed top surface portions 120 of the film 112.

In some of these examples, the method of use further comprises steps of: (0) unwinding the carrier 100 from a reel; and (3) winding the carrier 100 around a reel. In accordance with these examples, the carrier 100 advantageously can be provided wound around a reel, e.g. as noted above, for efficient shipment and/or storage before use. The step of (0) unwinding the carrier 100 from a reel can be carried out in preparation for steps (1) and (2), to expose the one or more openings 110 of the frame 102 along portions of the frame 102 so that the one or more objects 204 can be placed on the one or more exposed top surface portions 120 of the top surface 116 of the film 112 of the carrier 100, and so that the cover tape 126 can be reversibly attached to the top surface 106 of the frame 102 following the placement. The step of (3) winding the carrier 100 around a reel can be carried out following attachment of the cover tape 126. These steps advantageously can be carried out in the sequence (0) to (3) with respect to a given portion of the carrier 100, while being carried out simultaneously with respect to the carrier 100 as a whole, for example based on a continuous process of unwinding the carrier 100 from a first reel, placing the one or more objects 204, attaching the cover tape 126, and winding the carrier 100 around a second reel.

In some of these examples, the method of use further comprises steps of: (4) unwinding the carrier 100 from a reel; (5) removing the cover tape 126 from the carrier 100; and (6) removing the one or more objects 204 from the carrier 100. These steps can be carried out, for example, in downstream processes involving further packaging or use of the one or more objects 204. Like for steps (0) to (3), these steps (4) to (6) also advantageously can be carried out in the sequence (4) to (6) with respect to a given portion of the carrier 100, while being carried out simultaneously with respect to the carrier 100 as a whole, e.g. again based on a continuous process.

In some examples the removing of the one or more objects 204 from the carrier 100 is accomplished by picking the one or more objects 204 from the carrier 100. As noted above, the immobilization of the objects is reversible, as the tack of the exposed top surface portions 120 is sufficiently low to allow easy picking, e.g. vacuum picking and/or peeling, of the objects from the exposed top surface portions 120.

In some examples, the carrier 100 is used during one or more of a manufacturing process or a transportation process.

Figure 8:
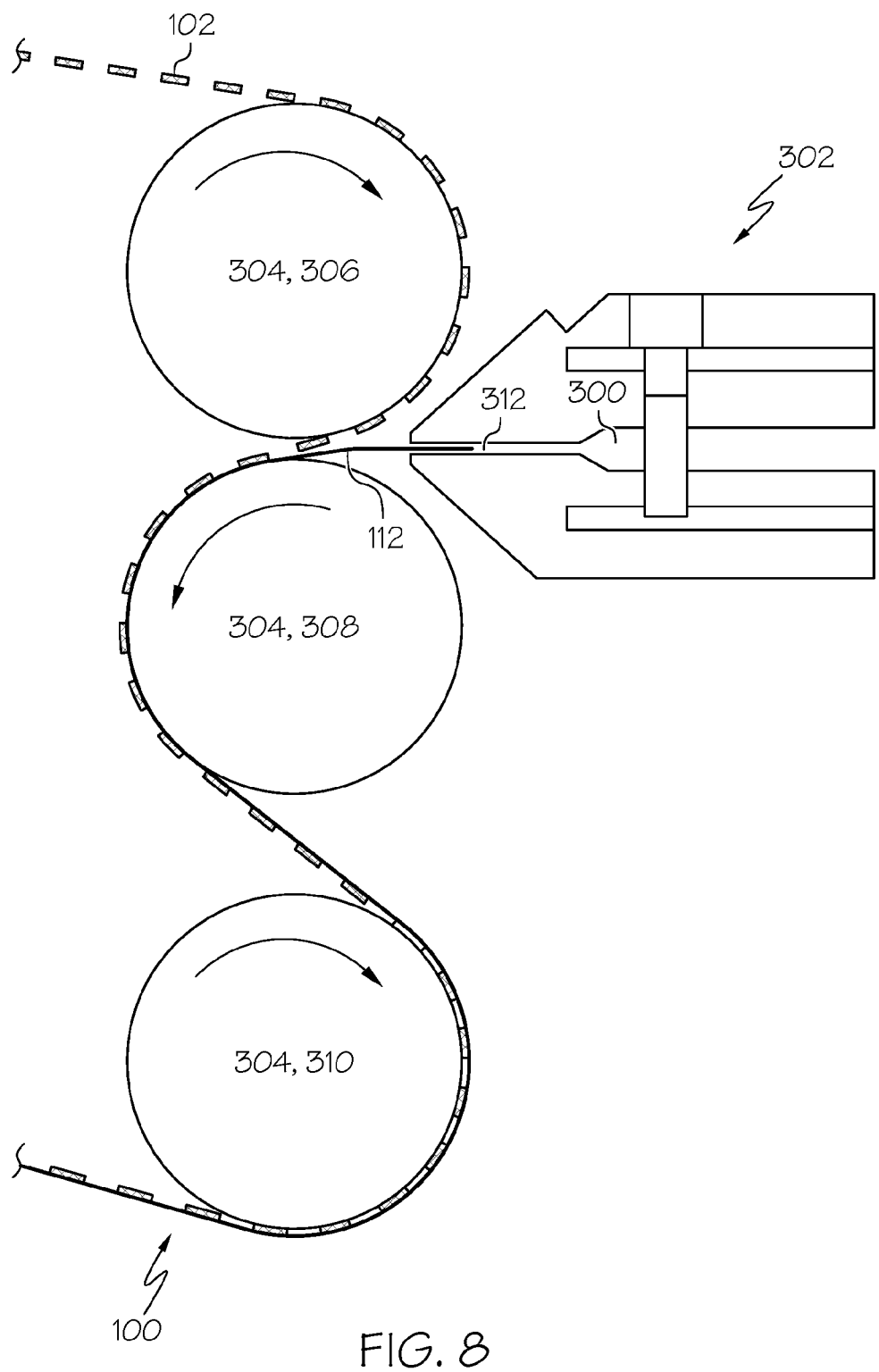
FIG. 8 is a schematic diagram in sectional view illustrating a melt flex-lip die used in an extrusion coating method that can be used to make a carrier according to the present disclosure.

A method of making a carrier 100 for reversibly immobilizing one or more objects also is provided. As shown in FIG. 8, with reference to FIGS. 1-3, the carrier 100 is as described above. Thus, the carrier 100 comprises (a) a frame 102 having a major axis 104, a top surface 106, a bottom surface 108, and one or more openings 110 through the frame 102 along the major axis 104. The carrier 100 also comprises (b) a film 112 comprising a thermoplastic elastomer material 114 and having a top surface 116 and a bottom surface 118. The film 112 is attached to the frame 102 based on thermal bonding of the top surface 116 of the film 112 to the bottom surface 108 of the frame 102, is under tension along the major axis 104 of the frame 102, and is free to flex at the one or more openings 110 through the frame 102. The top surface 116 of the film 112 comprises one or more exposed top surface portions 120 that are accessible through the one or more openings 110 through the frame 102. The one or more exposed top surface portions 120 exhibit a holding force on stainless steel as per ASTM D1000 that is greater than that of the bottom surface 118 of the film 112.

The carrier 100 of the method of making can embody the various examples of the carrier 100 as described above. Thus, for example, in some examples the frame 102 has a width of 6.0 to 60 mm, the frame 102 has a thickness of 0.10 to 5.0 mm, the one or more openings 110 each have an opening area of 2.0 to 1,100 mm$^2$, and/or the one or more openings 110, as seen from a top view, have a square shape, a rectangular shape, a circular shape, or an oval shape, among other examples of the carrier 100 as described above.

The method of making the carrier 100 comprises a step of: (1) extruding a film extrusion composition 300 comprising the thermoplastic elastomer material 114 onto the frame 102, thereby forming the film 112. The film 112 becomes attached to the frame 102 during the extruding based on thermal bonding, thereby forming the carrier 100. The step of extruding the film extrusion composition 300, thereby forming the film 112, advantageously allows for bonding of the film 112 to the frame 102 without use of any adhesive. In some examples, the extruding is accomplished by use of an extrusion die 302. Any suitable extrusion die can be used, such as, for example, a melt flex-lip extrusion die. Also in some examples, the thermal bonding comprises melting the top surface 116 of the film 112 to the bottom surface 108 of the frame 102. Also in some examples, the film 112 is attached to the frame 102 without use of adhesive or bonding agent.

As shown in FIG. 8, again with reference to FIGS. 1-3, in one example of the method of making the carrier 100, an extrusion die 302 is used to extrude the film extrusion composition 300 onto a frame 102 through which openings 110 have been punched. In an exemplary embodiment, the extrusion die 302 is a melt-flex lip die. Also as shown in FIG. 8, the frame 102 is carried by one or more rollers 304, e.g. a first roller 306, a second roller 308, and a third roller 310, as shown in FIG. 8. The film extrusion composition 300 can be heated and extruded from a nip 312 of the extrusion die 302 at the area between the first roller 306 and the second roller 308. As the frame 102 winds from the first roller 306 and the second roller 308, the film extrusion composition 300 is extruded onto the bottom surface 108 of the frame 102. The film extrusion composition 302 is heated to a temperature such that the thermoplastic elastomer material 114 is melted onto the surface of the frame 102, thereby thermally bonding the film 112 onto the frame 102. Advantageously, the film 112 can be bonded to the frame 102 without use of any adhesive. The resulting carrier 100 then winds from the third roller 310.

In some examples, the film extrusion composition 300 is heated to a temperature in the range of 170° C. to 230° C., and the nip pressure is in the range of 0.2 to 1.5 bars/linear inch. The resulting film 112 coated onto the frame 102 generally has a thickness in the range of 1 to 5 mil (0.025 to 0.13 mm).

The film 112 can have a one-layer structure 128, a two-layer structure 130, or a three-layer structure 136, as discussed above with reference to FIGS. 3-5, with the bottom surface 118 of the film 112 being provided with surface texturing, e.g. for a film 112 having a one-layer structure 128, or with the layer providing the bottom surface 118 of the film 112 having a higher modulus than the layer providing the top surface 116 of the film 112, e.g. for a film 112 having a two-layer structure 130 or a three-layer structure 136, also as discussed above. A film 112 having a one-layer structure 128 can be extruded as described above with respect to an extrusion die 302 that is a melt-flex lip die. A film 112 having a two-layer structure 130 or a three-layer structure 136 can be extruded similarly as for a film 112 having a one-layer structure 128, but will utilize two or three extruders, respectively, simultaneously feeding into a single die that is coupled with a feedblock (which is absent for extrusion of a film 112 having a one-layer structure 128) that brings the two or three layers together.

As shown in FIG. 8, again with reference to FIGS. 1-3, in some examples, the extruding comprises moving the frame 102 at a first velocity, and forming the film 112 at a second velocity, the first velocity being greater than the second velocity, the film 112 thereby being under tension along the major axis 104 of the frame 102 upon attachment to the frame 102. In order to provide the film 112 with properties suitable for use with respect to the carrier 100, and particularly to impart a suitable tension to the film 112, the velocity of rollers 304, and thus the frame 102, with respect to the velocity of the film extrusion composition 300 exiting the extrusion die 302, is specifically controlled. Moving the frame 102 at a first velocity, and forming the film 112 at a second velocity, the first velocity being greater than the second velocity, can impart a suitable tension to the film 112. As noted above, the first velocity can be, for example, 10 to 20 feet/min (3.0 to 6.1 m/min). Also as noted, the second velocity can be, for example, 5 to 10 feet/min (1.5 to 3.0 m/min).

In some examples, the method of making the carrier 100 further comprises a step of: (2) punching sprocket holes 122 in the frame 102, along the major axis 104 of the frame 102. The sprocket holes 122 advantageously can be used for feeding and guiding the carrier in a "pick and place" tool. The steps (1) and (2) can be carried out sequentially, first extruding the film extrusion composition 300, thereby forming the film 112, and then punching the sprocket holes 122.

In some examples, the method of making the carrier 100 further comprises a step of: (3) winding the carrier 100 around a reel 202. As noted above, the carrier 100 advantageously can be provided wound around a reel 202, e.g. for efficient shipment and/or storage after making the carrier 100, but before use.

It will be apparent to those skilled in the art that various modifications and variations can be made without departing from the spirit and scope of the claimed invention.

INDUSTRIAL APPLICABILITY

The carriers for reversibly immobilizing one or more objects disclosed herein are useful for reversibly immobilizing objects such as an electronic component, a wafer, a semiconductor material wafer, a silicon wafer, an integrated circuit wafer, a die, a semiconductor material die, a silicon die, an integrated circuit die, a photonic component, a photodiode component, a light emitting diode component, a pharmaceutical product, a pharmaceutical pill, a pharmaceutical capsule, a crystalline material object, or a jewel during manufacturing processes and/or transportation processes.

The invention claimed is:

1. A carrier for reversibly immobilizing one or more objects comprising:
   (a) a frame having a major axis, a top surface, a bottom surface, and one or more openings through the frame along the major axis; and
   (b) a film comprising a thermoplastic elastomer material and having a top surface and a bottom surface, the thermoplastic elastomer material being present at the top surface and the bottom surface;
   wherein:
   (i) the film is attached to the frame based on thermal bonding of the top surface of the film to the bottom surface of the frame, is under tension along the major axis of the frame, and is free to flex at the one or more openings through the frame;
   (ii) the top surface of the film comprises one or more exposed top surface portions that comprise the thermoplastic elastomer material and are accessible through the one or more openings through the frame; and
   (iii) the one or more exposed top surface portions exhibit a holding force on stainless steel as per ASTM D1000 due to the thermoplastic elastomer material at the top surface that is greater than that of the bottom surface of the film.

2. The carrier of claim 1, wherein the frame comprises a plastic material.

3. The carrier of claim 2, wherein the plastic material comprises one or more of polystyrene (PS), polycarbonate (PC), low density polyethylene (LDPE), high density polyethylene (HDPE), ethylene vinyl acetate (EVA), polypropylene, or an engineering plastic.

4. The carrier of claim 2, wherein the frame further comprises an additive that provides electrostatic discharge properties.

5. The carrier of claim 1, wherein the thermal bonding comprises melting the top surface of the film to the bottom surface of the frame.

6. The carrier of claim 1, wherein the film is attached to the frame without use of adhesive or bonding agent.

7. The carrier of claim 1, wherein the one or more exposed top surface portions are unsupported.

8. The carrier of claim 1, wherein the thermoplastic elastomeric material of the film comprises one or more of thermoplastic urethane (TPU), thermoplastic co-polyesters (COPE), thermoplastic co-polyamides (COPA), thermoplastic olefin elastomer (e.g. copolymer of ethylene with one or more of propylene, butene, or octene), styrene-ethylene-butylene-styrene (SEBS), styrene-ethylene-propylene-styrene (SEPS), styrene-ethylene-ethylene-butylene-styrene (SEEBS), styrene-butadiene-styrene (SBS), styrene-isoprene-styrene (SIS), styrene-isobutylene-styrene (SIBS), poly(methyl methacrylate)-b-poly(n-butyl acrylate)-b-poly (methyl methacrylate) (PMMA-b-PnBA-b-PMMA), or ethylene vinyl acetate (EVA).

9. The carrier of claim 1, wherein the film further comprises an additive that provides electrostatic discharge properties.

10. The carrier of claim 1, wherein the film exhibits one or more of the following properties:
    hysteresis of less than 9% when stretched up to 100%;
    elongation of greater than 400% at break;
    a tan $\Delta$ of less than 0.2 at room temperature (20° C.) when measured at 1 hertz;
    a primary $T_g$ lower than −20° C. when measured at 1 hertz;
    a Shore A durometer of less than 75 A; or
    a number average molecular weight ($M_n$) of a primary elastomer molecule of the thermoplastic elastomer material in final form being greater than 50,000 daltons.

11. The carrier of claim 1, wherein the film has a one-layer structure having a uniform composition.

12. The carrier of claim 1, wherein the film has a two-layer structure comprising a first layer and an opposite second layer attached to the first layer, the first layer and the second layer both having a uniform composition, the uniform composition of the first layer being different than the uniform composition of the second layer.

13. The carrier of claim 1, wherein the film has a three-layer structure comprising a first layer, an opposite second layer, and a third layer between the first layer and the second layer, the third layer bonding the first layer and the second layer, the first layer and the second layer both having a uniform composition, the uniform composition of the first layer being different than the uniform composition of the second layer.

14. The carrier of claim 1, wherein the one or more exposed top surface portions exhibit a holding force on stainless steel as per ASTM D1000 that is greater than that of the bottom surface of the film based on one or more of:
the bottom surface of the film having a higher modulus than the one or more exposed top surface portions; or
the bottom surface of the film being more texturized than the one or more exposed top surface portions.

15. The carrier of claim 1, wherein the one or more exposed top surface portions of the top surface of the film exhibit a holding force on stainless steel as per ASTM D1000 of less than 1.0 ounce per inch (less than 11 g/cm).

16. A tape and reel carrier device, the carrier device comprising:
(a) the carrier of claim 1; and
(b) a reel;
wherein the carrier is a tape, and the carrier is wound around the reel.

17. A method of making the carrier of claim 1, comprising a step of:
(1) extruding a film extrusion composition comprising the thermoplastic elastomer material onto the frame, thereby forming the film;
wherein the film becomes attached to the frame during the extruding based on thermal bonding, thereby forming the carrier.

18. The method of claim 17, wherein the thermal bonding comprises melting the top surface of the film to the bottom surface of the frame.

19. The method of claim 17, wherein the film is attached to the frame without use of adhesive or bonding agent.

20. The method of claim 17, wherein the extruding comprises moving the frame at a first velocity, and forming the film at a second velocity, the first velocity being greater than the second velocity, the film thereby being under tension along the major axis of the frame upon attachment to the frame.

\* \* \* \* \*